(12) United States Patent
Chung et al.

(10) Patent No.: US 10,304,764 B2
(45) Date of Patent: May 28, 2019

(54) FILM PRODUCT, FILM PACKAGES AND PACKAGE MODULES USING THE SAME

(71) Applicant: Samsung Electronics Co., Ltd., Suwon-si, Gyeonggi-do (KR)

(72) Inventors: Yechung Chung, Hwaseong-si (KR); Woonbae Kim, Seoul (KR); Soyoung Lim, Hwaseong-si (KR); Jeong-Kyu Ha, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 15/465,146

(22) Filed: Mar. 21, 2017

(65) Prior Publication Data

US 2017/0372992 A1 Dec. 28, 2017

(30) Foreign Application Priority Data

Jun. 24, 2016 (KR) .................. 10-2016-0079518

(51) Int. Cl.
*H01L 23/498* (2006.01)
*H01L 23/00* (2006.01)

(52) U.S. Cl.
CPC .... *H01L 23/49827* (2013.01); *H01L 23/4985* (2013.01); *H01L 23/49838* (2013.01); *H01L 24/09* (2013.01); *H01L 2224/0912* (2013.01)

(58) Field of Classification Search
None
See application file for complete search history.

(56) References Cited

U.S. PATENT DOCUMENTS

| | | | |
|---|---|---|---|
| 5,818,252 A | 10/1998 | Fullman et al. | |
| 6,300,997 B1 * | 10/2001 | Saito | G02F 1/1345 349/149 |
| 6,344,754 B1 | 2/2002 | Tamai | |
| 6,853,090 B2 | 2/2005 | Kim et al. | |
| 6,899,544 B2 | 5/2005 | Tanokura et al. | |
| 7,087,987 B2 | 8/2006 | Chung et al. | |
| 7,414,323 B2 | 8/2008 | Hirae | |
| 7,725,785 B2 | 5/2010 | Her | |
| 8,384,407 B2 | 2/2013 | Lim et al. | |
| 8,853,694 B2 | 10/2014 | Han et al. | |
| 9,082,710 B2 | 7/2015 | Tang | |

(Continued)

FOREIGN PATENT DOCUMENTS

| | | |
|---|---|---|
| CN | 1591841 A | 3/2005 |
| JP | 2010050296 A | 3/2010 |

(Continued)

*Primary Examiner* — Charles D Garber
*Assistant Examiner* — Xiaoming Liu
(74) *Attorney, Agent, or Firm* — Harness, Dickey & Pierce, P.L.C.

(57) ABSTRACT

In an embodiment, the film product includes a film substrate having a first surface and a second surface opposite the first surface. The film substrate has a length in a first direction and a width in a second direction perpendicular to the first direction. A first plurality of pads is on one of the first surface and the second surface, and the first plurality of pads is arranged in a third direction, the third direction being diagonal with respect to at least one of the first direction and the second direction. At least one merge line is electrically connecting at least two of the first plurality of pads.

19 Claims, 25 Drawing Sheets

(56) References Cited

U.S. PATENT DOCUMENTS

| | | | |
|---|---|---|---|
| 9,241,407 B2 | 1/2016 | Ha et al. | |
| 2007/0013857 A1* | 1/2007 | Chung | G02F 1/13452 349/152 |
| 2009/0268147 A1* | 10/2009 | Tang | H01L 24/17 349/151 |
| 2013/0248863 A1* | 9/2013 | Tang | H01L 22/30 257/48 |
| 2016/0197020 A1 | 7/2016 | Lim et al. | |
| 2016/0218065 A1* | 7/2016 | Ha | H01L 23/4985 |

FOREIGN PATENT DOCUMENTS

| | | | |
|---|---|---|---|
| JP | 2015172530 A | 10/2015 | |
| KR | 100785975 B1 | 12/2007 | |
| KR | 20160083978 A | 7/2016 | |

\* cited by examiner

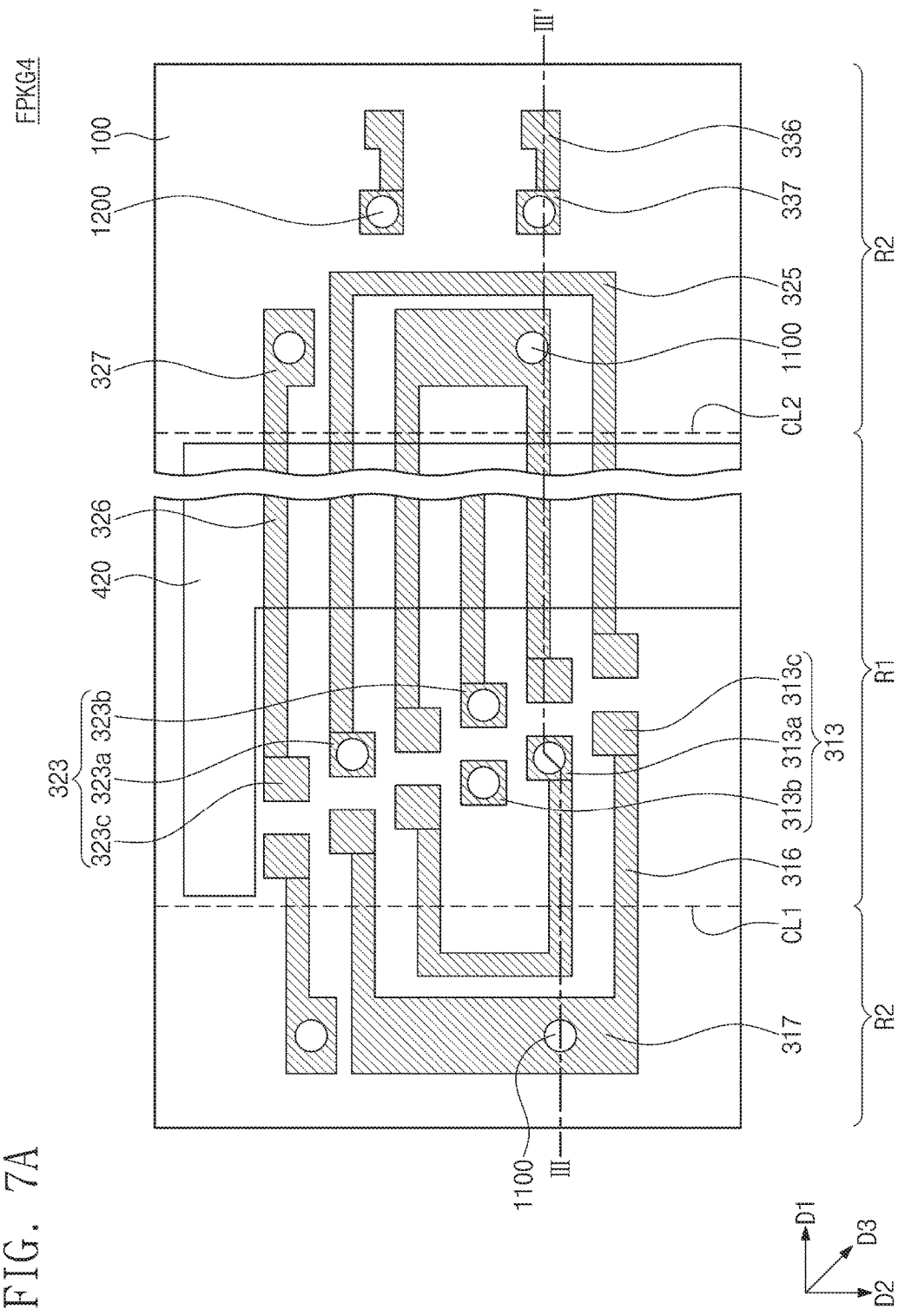

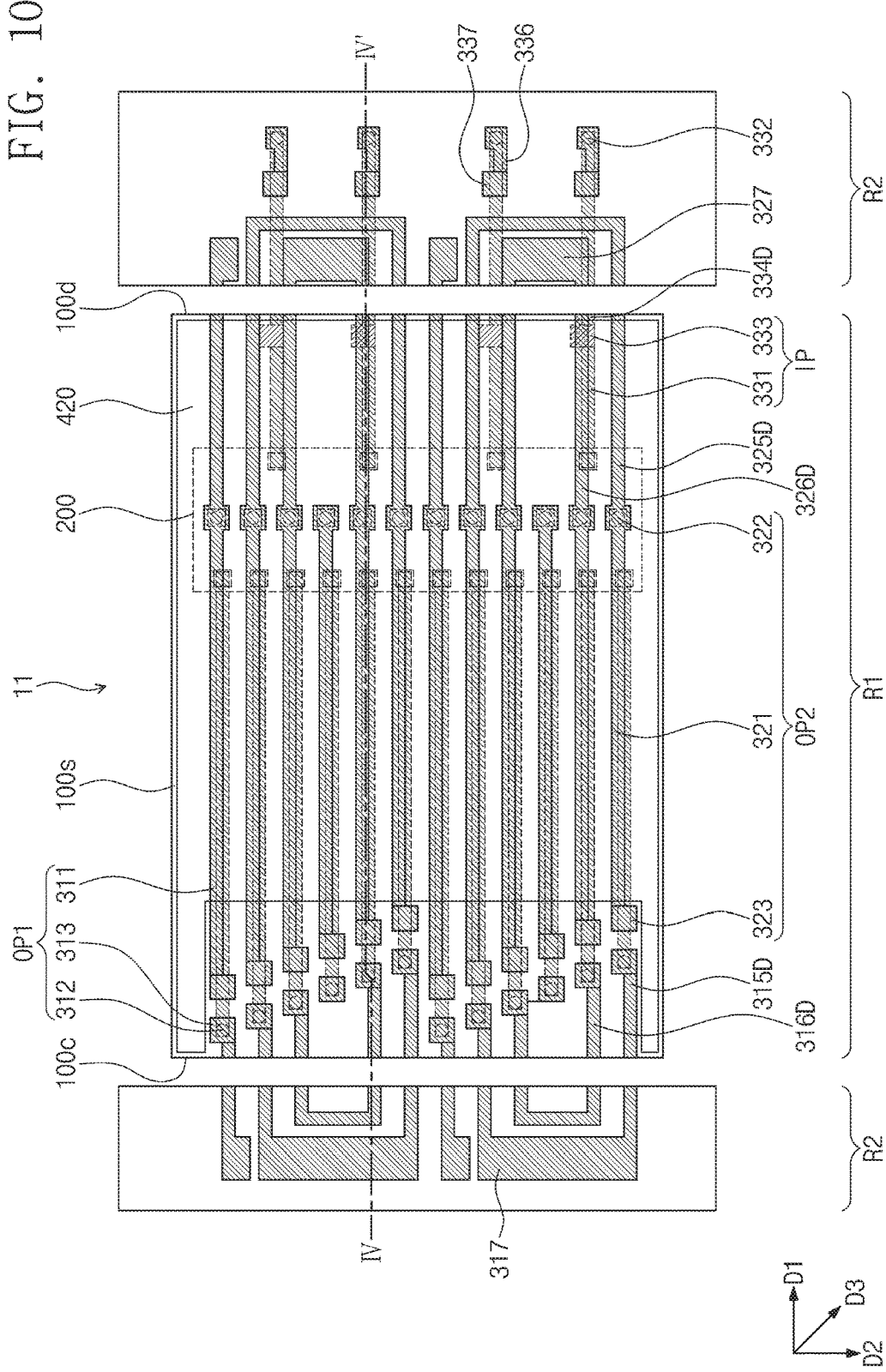

FILM PRODUCT, FILM PACKAGES AND PACKAGE MODULES USING THE SAME

CROSS-REFERENCE TO RELATED APPLICATION

This U.S. non-provisional patent application claims priority under 35 U.S.C. § 119 to Korean Patent Application No. 10-2016-0079518, filed on Jun. 24, 2016, in the Korean Intellectual Property Office, the disclosure of which is hereby incorporated by reference in its entirety.

BACKGROUND

Embodiments of the inventive concepts relate to a semiconductor package and, more particularly, to chip-on-film (COF) packages and package modules using the same.

A chip-on-film (COF) package technique using a flexible film substrate has been developed to provide small, thin and light electronic products. According to the COF package technique, a semiconductor chip may be mounted directly on the flexible film substrate by a flip-chip bonding method and may be electrically connected to an external circuit through short lead lines. COF packages realized by this technique may be applied to portable devices (e.g., a cellular phone or a personal digital assistant (PDA)), laptop computers, and panels of display devices.

SUMMARY

Embodiments of the inventive concepts may provide highly integrated film packages and package modules using the same.

Embodiments of the inventive concepts may also provide film packages having electrical characteristics that be quickly tested, and package modules using the same.

At least one embodiment relates to a film product.

In an embodiment, the film product includes a film substrate having a first surface and a second surface opposite the first surface. The film substrate has a length in a first direction and a width in a second direction perpendicular to the first direction. A first plurality of pads is on one of the first surface and the second surface, and the first plurality of pads is arranged in a third direction, the third direction being diagonal with respect to at least one of the first direction and the second direction. At least one merge line is electrically connecting at least two of the first plurality of pads.

At least one embodiment relates to a film package.

In one embodiment, the film package includes a film substrate having a first surface and a second surface opposite the first surface. The film substrate has a length in a first direction and a width in a second direction perpendicular to the first direction. A first plurality of pads is on the second surface, and the first plurality of pads are arranged in a third direction, the third direction being diagonal with respect to at least one of the first direction and the second direction. A semiconductor chip is on the first surface. A first connection structure is electrically connecting the semiconductor chip to the first plurality of pads. A first plurality of conductive lines is on the second surface, each of the first plurality of conductive lines extending from a first edge of the film substrate to a respective one of the first plurality of conductive pads such that the first plurality of conductive lines have different lengths.

In another embodiment, the film package includes a film substrate having a first surface and a second surface opposite the first surface. The film substrate has a length in a first direction and a width in a second direction perpendicular to the first direction. A first plurality of pads is on the second surface, and the first plurality of pads are arranged in a third direction, the third direction being diagonal with respect to at least one of the first direction and the second direction. A semiconductor chip is on the first surface. A first connection structure electrically connects the semiconductor chip to the first plurality of pads, the first connection structure includes a plurality of first vias extending from the first to the second surface, and each of the plurality of first vias is electrically connected to a respective one of the first plurality of pads. A first plurality of conductive lines is on the first surface. Each of the first plurality of conductive lines extends from a first edge of the film substrate to a respective one of the plurality of first vias such that the first plurality of conductive lines have different lengths.

At least one embodiment relates to a package module.

In one embodiment, the package module includes a display, a circuit substrate, and a film package electrically connected to the circuit substrate and the display. The film package includes a film substrate having a first surface and a second surface opposite the first surface, where the film substrate having a length in a first direction and a width in a second direction perpendicular to the first direction, a first plurality of pads on one of the first surface and the second surface, where the first plurality of pads arranged in a third direction, and the third direction is diagonal with respect to at least one of the first direction and the second direction, and a first plurality of conductive lines on the second surface, where each of the first plurality of conductive lines extends from a first edge of the film substrate to a respective one of the first plurality of conductive pads such that the first plurality of conductive lines have different lengths.

At least one embodiment relates to a method of manufacture.

In one embodiment, the method includes providing a film substrate having a first surface and a second surface opposite the first surface, where the film substrate has a length in a first direction and a width in a second direction perpendicular to the first direction; forming a plurality of first vias extending from the first surface to the second surface, where the plurality of first vias is arranged in a third direction, and the third direction is diagonal with respect to at least one of the first direction and the second direction; and forming at least one merge line electrically connecting a pair of the plurality of first vias.

BRIEF DESCRIPTION OF THE DRAWINGS

The inventive concepts will become more apparent in view of the attached drawings and accompanying detailed description.

FIG. 7A is a plan view illustrating a method of testing a film package according to some embodiments of the inventive concepts.

FIG. 10A is a plan view illustrating a method of manufacturing a semiconductor package according to some embodiments of the inventive concepts.

DETAILED DESCRIPTION OF THE EMBODIMENTS

Figure 1:
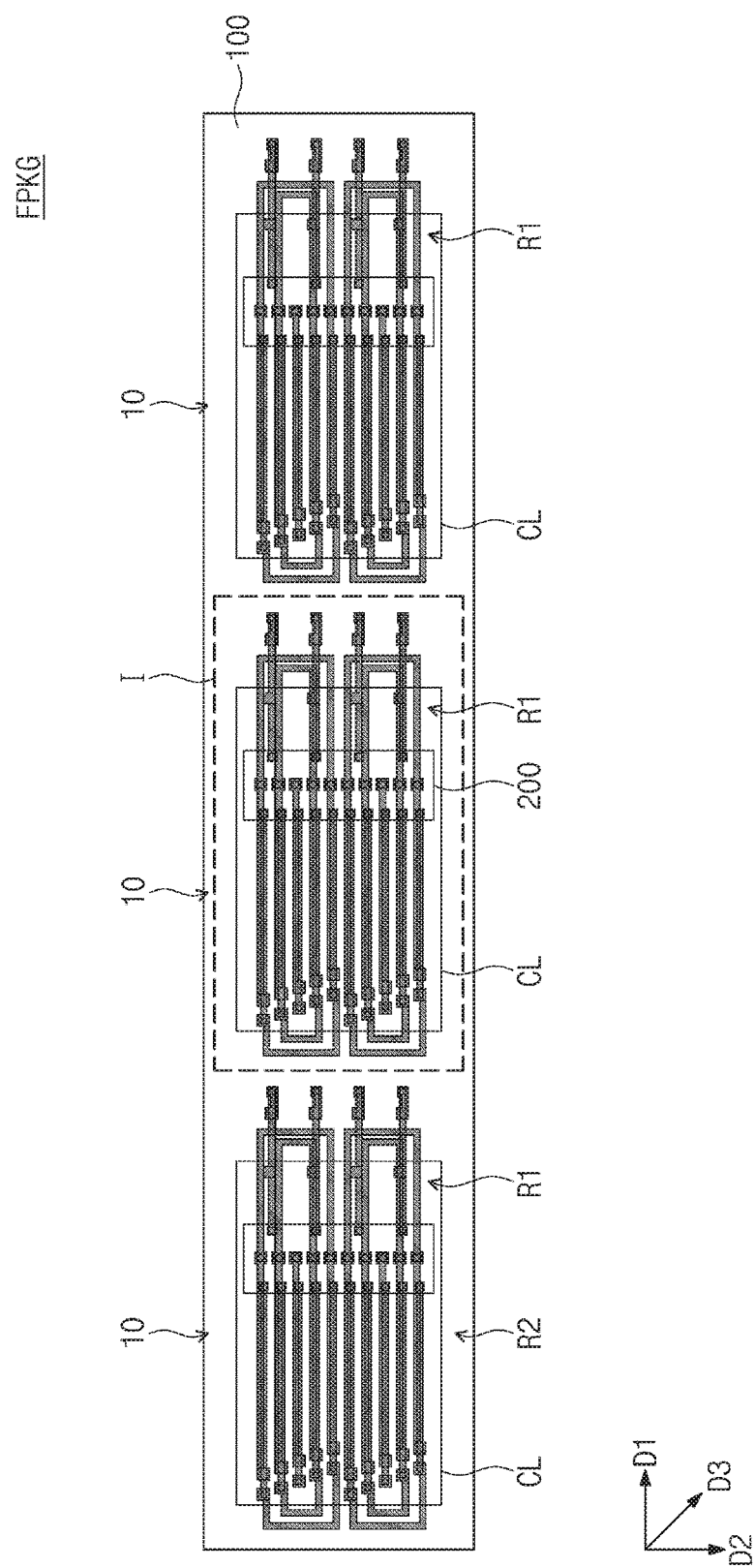
FIG. 1 is a layout diagram illustrating a film package according to some embodiments of the inventive concepts.

It will be understood that when an element is referred to as being "connected" or "coupled" to another element, it may be directly connected or coupled to the other element or intervening elements may be present.

Similarly, it will be understood that when an element such as a layer, region or substrate is referred to as being "on" another element, it can be directly on the other element or intervening elements may be present. In contrast, the term "directly" means that there are no intervening elements. Additionally, the embodiment in the detailed description will be described with sectional views as ideal exemplary views of the inventive concepts. Accordingly, shapes of the exemplary views may be modified according to manufacturing techniques and/or allowable errors.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

Exemplary embodiments of aspects of the present inventive concepts explained and illustrated herein include their complementary counterparts. The same reference numerals or the same reference designators denote the same elements throughout the specification.

A film substrate and a film package according to some embodiments of the inventive concepts will be described hereinafter.

FIG. 1 is a layout diagram illustrating a film package according to some embodiments of the inventive concepts.

Referring to FIG. 1, a film package FPKG may include a film product. The film product includes a film substrate 100. The film substrate 100 may include a polymer material, e.g., polyimide or polyester. The film substrate 100 may be flexible. The film substrate 100 may include first regions R1 and a second region R2. A cut line CL may be disposed between the second region R2 and the first regions R1 to define the first regions R1. A cut line CL may be an imaginary line in the film package FPKG. The first regions R1 may be arranged in a first direction D1. The second region R2 may surround each of the first regions R1. The first regions R1 may form semiconductor packages 10 to be described later with reference to FIGS. 9A to 9C. Semiconductor chips 200 may be mounted on the first regions R1 of the film substrate 100. Hereinafter, one semiconductor package 10 will be mainly described in detail.

Figure 2A:
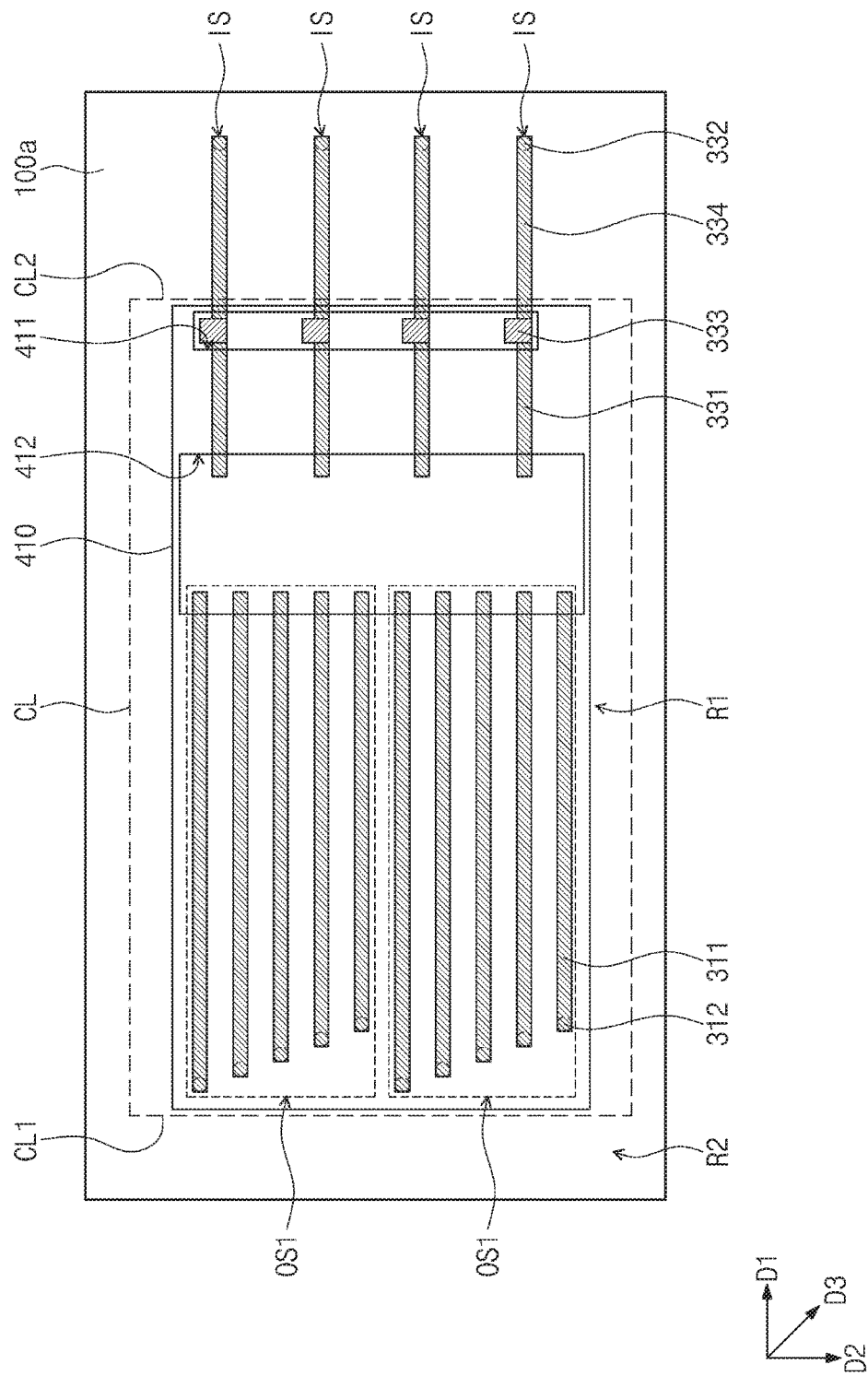
FIG. 2A is a top view illustrating a film substrate according to some embodiments of the inventive concepts.
Figure 2B:
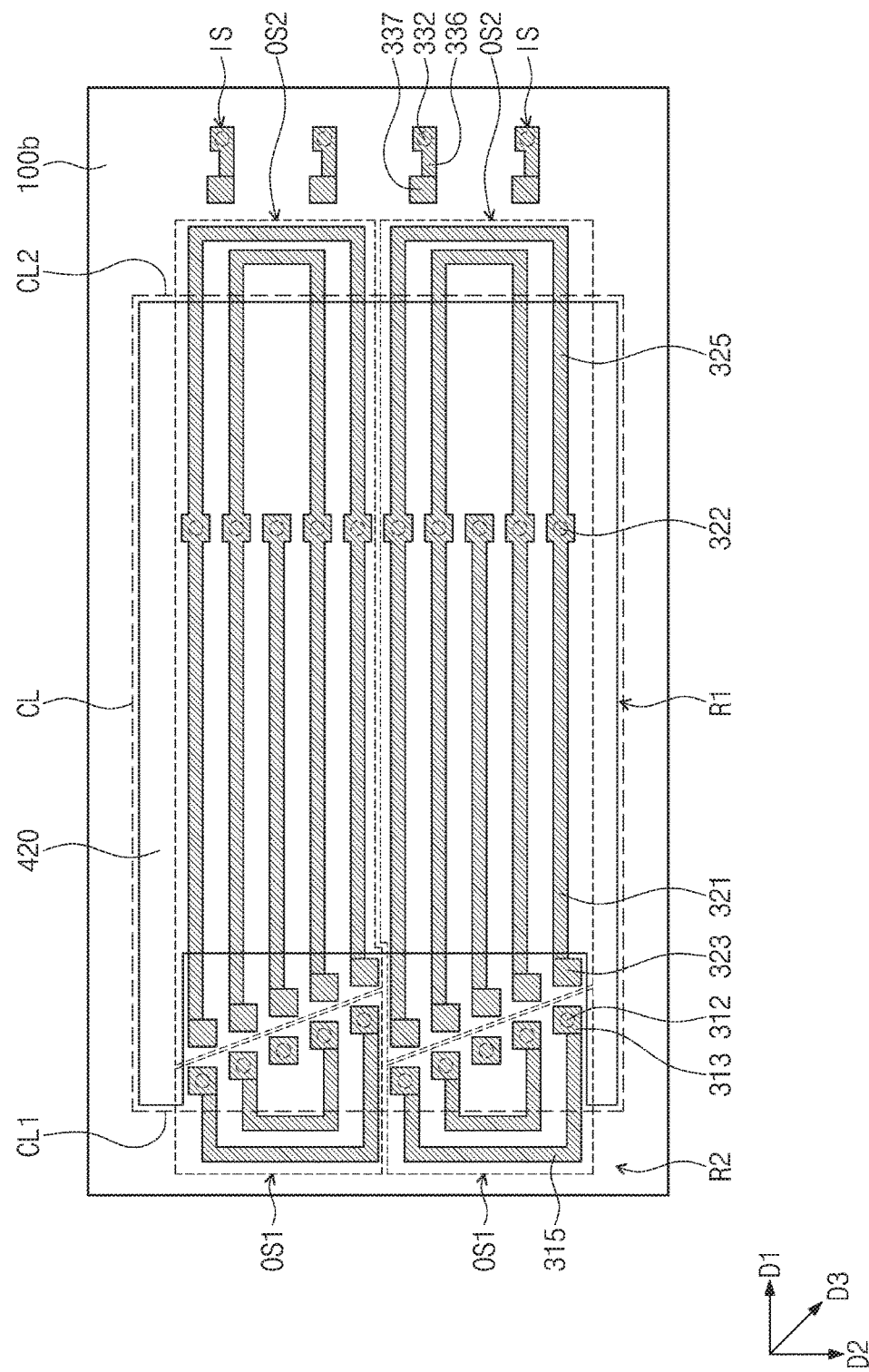
FIG. 2B is a bottom view illustrating a film substrate according to some embodiments of the inventive concepts.
Figure 2C:
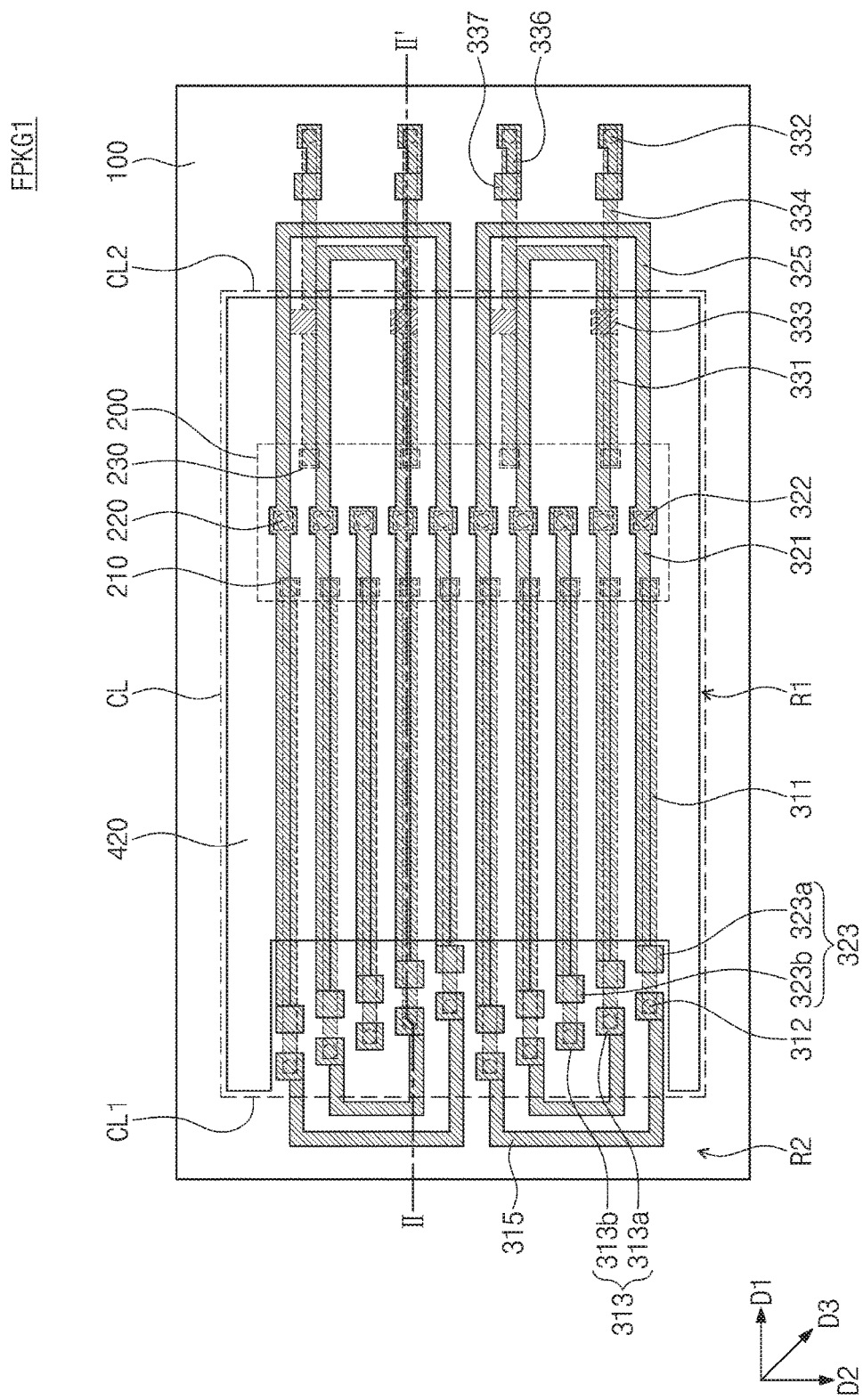
FIG. 2C is a plan view illustrating a film package according to some embodiments of the inventive concepts.
Figure 2D:
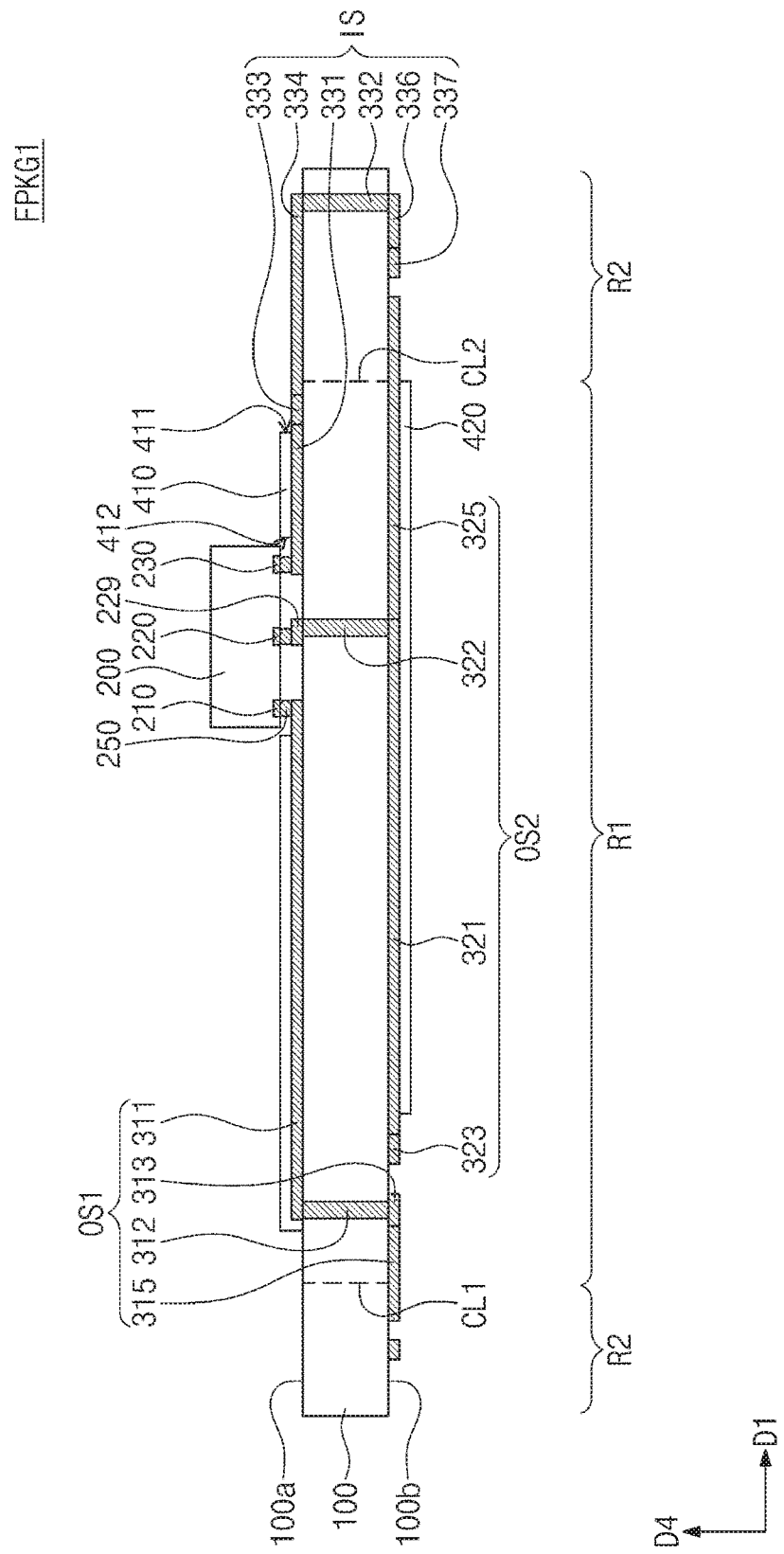
FIG. 2D is a cross-sectional view taken along a line II-II' of FIG. 2C.

FIG. 2A is a top view corresponding to a region I of FIG. 1 to illustrate a film substrate according to some embodiments of the inventive concepts. FIG. 2B is a bottom view corresponding to the region I of FIG. 1 to illustrate a film substrate according to some embodiments of the inventive concepts. FIG. 2C is an enlarged plan view corresponding to the region I of FIG. 1 to illustrate a film package according to some embodiments of the inventive concepts. FIG. 2D is a cross-sectional view taken along a line II-II' of FIG. 2C. Hereinafter, the descriptions to the same elements as mentioned above will be omitted or mentioned briefly for the purpose of ease and convenience in explanation.

Referring to FIGS. 1 and 2A to 2D, a film package FPKG1 may include a film product and a semiconductor chip 200. The film product may include a film substrate 100, first output structures OS1, second output structures OS2, and input structures IS. The film substrate 100 may have a first surface 100a and a second surface 100b which face opposite or any from each other. A cut line CL may include a first cut line CL1 and a second cut line CL2 which are opposite ends or sides to each other. The first cut line CL1 and the second cut line CL2 may be parallel to a second direction D2 when viewed from a plan view. Here, the first direction D1 and the second direction D2 may be parallel to the first surface 100a of the film substrate 100. The second direction D2 may be perpendicular to the first direction D1.

The semiconductor chip 200 may be mounted on the first surface 100a of the first region R1 of the film substrate 100. For example, the semiconductor chip 200 may be mounted on the film substrate 100 of FIGS. 2A and 2B to manufacture the film package FPKG1 of FIGS. 2C and 2D. The semiconductor chip 200 may include first output chip pads 210, second output chip pads 220, and input chip pads 230 which are disposed on a bottom surface of the semiconductor chip 200. The first output chip pads 210 may be adjacent to a side of the semiconductor chip 200 when viewed from a plan view. The second output chip pads 220 may be provided between the first output chip pads 210 and the input chip pads 230. Connection terminals 250 may be disposed between the film substrate 100 and the semiconductor chip 200 so as to be connected to the chip pads 210, 220, and 230. For example, each of the connection terminals 250 may be a bump or a solder ball.

The input structures IS may be provided on the film substrate 100 so as to be electrically connected to the semiconductor chip 200. The input structures IS may be spaced apart from each other in the second direction D2 when viewed from a plan view. The input structures IS may include a metal such as copper or aluminum. Each of the input structures IS may include an input or signal line 331, an input pad 333, a first input test line 334, an input via 332, a second input test line 336, and an input test pad 337. The input lines 331 may be provided on the first surface 100a of the first region R1 of the film substrate 100 so as to be connected to the input chip pads 230. The input pads 333 may be provided on the first surface 100a of the first region R1 of the film substrate 100 and may be adjacent to the second cut line CL2. The input pads 333 may be electrically connected to the semiconductor chip 200 through the input lines 331. The first input test lines 334 may extend from the input pads 333 to the second region R2 through the second cut line CL2 on the first surface 100a of the film substrate 100. The second input test lines 336 may be provided on the second surface 100b of the second region R2 of the film substrate 100. The input vias 332 may penetrate the film substrate 100 and may be connected to the first input test lines 334 and the second input test lines 336. The input test pads 337 may be provided on the second surface 100b of the second region R2 of the film substrate 100 and may be adjacent to the second cut line CL2. The input test pads 337 may be electrically connected to the input pads 333 through the second input test lines 336, the input vias 332, and the first input test lines 334, respectively.

The first output structures OS1 may be provided on the film substrate 100 so as to be connected to the semiconductor chip 200. The first output structures OS1 may be arranged along the second direction D2 when viewed from a plan view. The first output structures OS1 may include a metal such as copper or aluminum. The first output structures OS1 may include first signal lines 311, first output vias 312, first output pads 313, and first merging lines 315. The first signal lines 311 will hereinafter be referred to as first output lines 311. The first output lines 311 may be provided on the first surface 100a of the first region R1 of the film substrate 100. The first output lines 311 may be electrically connected to the first output chip pads 210 through the connection terminals 250.

The first output vias 312 may penetrate the first region R1 of the film substrate 100. The first output vias 312 may be connected to the first output lines 311. The first output vias 312 may be adjacent to the first cut line CL1 and may be laterally spaced apart from the semiconductor chip 200 when viewed from a plan view.

The first output pads 313 may be disposed on the second surface 100b of the first region R1 of the film substrate 100 and may be adjacent to the first cut line CL1. The first output pads 313 may overlap with the first output vias 312, respectively, when viewed from a plan view. The first output pads 313 may be connected directly to the first output vias 312. The first output pads 313 may act as via pads, and thus via pads may be omitted. As a result, a planar size of the film package FPKG1 may be reduced. In the present specification, a size of an element may include a width and/or a length thereof. The length of the element may mean a length in the first direction D1, and the width of the element may mean a width in the second direction D2. A length and a width of each of the first output pads 313 may be greater than a diameter of a corresponding one of the first output vias 312. Thus, even though the diameters of the first output vias 312 are varied in a process tolerance when the first output vias 312 are formed, the first output vias 312 may be stably and reliably connected to the first output pads 313. Hereinafter, a planar shape of one of the first output structures OS1 will be described in more detail.

The first output pads 313 may be spaced apart from each other and may not be arranged in the first direction D1 and the second direction D2. The first output pads 313 may be disposed at different distances in the first direction D1 from the first cut line CL1. For example, the first output pads 313 (or the first output vias 312) may be arranged in a diagonal direction D3 when viewed from a plan view. The diagonal direction D3 may intersect the first direction D1 and the second direction D2. If the first output pads 313 are arranged in the second direction D2, a width of the film substrate 100 may increase. In some embodiments, since the first output pads 313 are not arranged in the second direction D2, distances in the second direction D2 between the first output pads 313 may be reduced. As a result, the length of the film substrate 100 can be reduced. The first output pads 313 may include a first sub-output pad 313a and a second sub-output pad 313b (see FIG. 2C).

Stated another way, the first output pads 313 are arranged in the direction D3 which is diagonal to at least one of the first and second directions D1 and D2. Namely, the third direction D3 is non-perpendicular to the first and second directions D1 and D2. As such, it will be appreciated that the first output vias 312 are arranged in the direction D3.

The first merging line 315 may be provided on the second surface 100b of the film substrate 100. The merging line 315 may extend from the first output pads 313 disposed on the first region R1 of the film substrate 100 onto the second region R2 of the film substrate 100 in a direction opposite to the first direction D1. The first merging line 315 may overlap with the first cut line CL1. The first merging line 315 may have a U-shape that includes a first leg, a second leg and a bent portion when viewed from a plan view. The bent portion of the first merging line 315 may be provided on the second region R2 of the film substrate 100. The first merging line 315 may be connected to at least two (e.g., the first sub-output pads 313a) of the first output pads 313 through the bent portion. In one embodiment, the two output pads are not adjacent. The second sub-output pad 313b may not be connected to a first merging line 315. Unlike FIGS. 2B and 2C, the second sub-output pad 313b may be omitted.

The second output structures OS2 may be provided on the film substrate 100 so as to be electrically connected to the semiconductor chip 200. The second output structures OS2 may be arranged along the second direction D2 when viewed from a plan view. The second output structures OS2 may include second signal lines 321, second output vias 322, second output pads 323, and second merging lines 325. The second signal lines 321 will hereinafter be referred to as second output lines 321. The second output vias 322 may penetrate the film substrate 100. The second output vias 322 may overlap with the semiconductor chip 200 when viewed from a plan view. The second output vias 322 may be electrically connected to the second output chip pads 220. Connection patterns 229 may be provided on the first surface 100a of the film substrate 100 to connect the connection terminals 250 to the second output vias 322.

The second output lines 321 may be disposed on the second surface 100b of the first region R1 of the film substrate 100 and may be connected to the second output vias 322. The second output lines 321 may extend from the second output vias 322 in the direction opposite to the first direction D1 when viewed from a plan view.

The second output pads 323 may be provided on the second surface 100b of the first region R1 of the film substrate 100. The second output pads 323 may be adjacent to the first output pads 313. The second output pads 323 may be spaced apart from each other and may not be arranged in the first direction D1 and the second direction D2. In one of the second output structures OS2, the second output pads 323 may be disposed at different distances in the first direction D1 from the first cut line CL1. For example, the second output pads 323 may be arranged in the diagonal direction D3 when viewed from a plan view. Thus, the size of the film package FPKG1 may be reduced. The second output pads 323 may include a third sub-output pad 323a and a fourth sub-output pad 323b.

A sum of the number of the first output pads 313 and the number of the second output pads 323 may be more than the number of the input pads 333. The first output pads 313 and the second output pads 323 may be adjacent to the first cut line CL1 when viewed from a plan view. As illustrated in FIG. 2D, the first output lines 311 may be disposed on the first surface 100a of the film substrate 100 and the second output lines 321 may be disposed on the second surface 100b of the film substrate 100. Thus, the first output lines 311 may be spaced apart from the second output lines 321 in a vertical direction D4. The vertical direction D4 may intersect (e.g., be perpendicular to) the first to third directions D1, D2, and D3. The first output lines 311 may be insulated from the second output lines 321. Also, as will be appreciated from FIGS. 2A and 2B, the first output lines 311 have different lengths and the second output lines 321 have different lengths. As illustrated in FIG. 2C, the first output lines 311 may partially overlap with the second output lines 321 when viewed from a plan view. Thus, the size of the film substrate 100 may be reduced.

The second merging line 325 may be provided on the second surface 100b of the film substrate 100. The second merging line 325 may extend from the first region R1 of the film substrate 100 onto the second region R2 of the film substrate 100 through the second cut line CL2. For example, the second merging line 325 may extend from the second output vias 322 in the first direction D1. The second merging line 325 may have a U-shape that includes a first leg, a second leg, and a bent portion on the second region R2 of the film substrate 100 when viewed from a plan view. The second merging line 325 may be electrically connected to at least two third sub-output pads 323a by the bent portion. The fourth sub-output pad 323b may not be connected to the second merging line 325. In certain embodiments, the fourth sub-output pad 323b may be omitted.

The first merging line 315, the first output pads 313, the second output pads 323, the second output lines 321, the second merging line 325, the input test pads 337, and the second input test lines 336 may be formed by the same process and at the same time. For example, the first merging line 315, the first output pads 313, the second output pads 323, the second output lines 321, the second merging line 325, the input test pads 337, and the second input test lines 336 may include the same material and may have the same thickness. The first output lines 311, the input lines 331, the input pads 333, and the first input test lines 334 may be formed by the same process and at the same time. For example, the first output lines 311, the input lines 331, the input pads 333, and the first input test lines 334 may include the same material and may have the same thickness.

An upper protection layer 410 may be disposed on the first surface 100a of the first region R1 of the film substrate 100 and may cover the first output lines 311 and the input lines 331 (see FIG. 2A). The upper protection layer 410 may have upper a first opening 411 and a second opening 412 (see FIG. 2A). The first opening 411 may expose the input pads 333, and the second opening 412 may expose ends of the first output lines 311 and ends of the input line 331. Unlike FIG. 2D, the upper protection layer 410 may extend onto the second region R2 of the film substrate 100 to cover the first input test lines 334.

A lower protection layer 420 may be disposed on the second surface 100b of the first region R1 of the film substrate 100 and may cover the second output lines 321 and the second merging line 325. The lower protection layer 420 may expose the first output pads 313 and the second output pads 323 (see FIG. 2B). Unlike FIG. 2D, the lower protection layer 420 may extend onto the second region R2 of the film substrate 100 to seal the first merging line 315 and the second merging line 325. In this case, the lower protection layer 420 may have an opening to expose the first output pads 313 and the second output pads 323. The lower protection layer 420 and/or the upper protection layer 410 may include an insulating material, e.g., solder resist. Hereinafter, a method of testing the film package FPKG1 will be described with reference to FIGS. 3A to 3C.

Figure 3A:
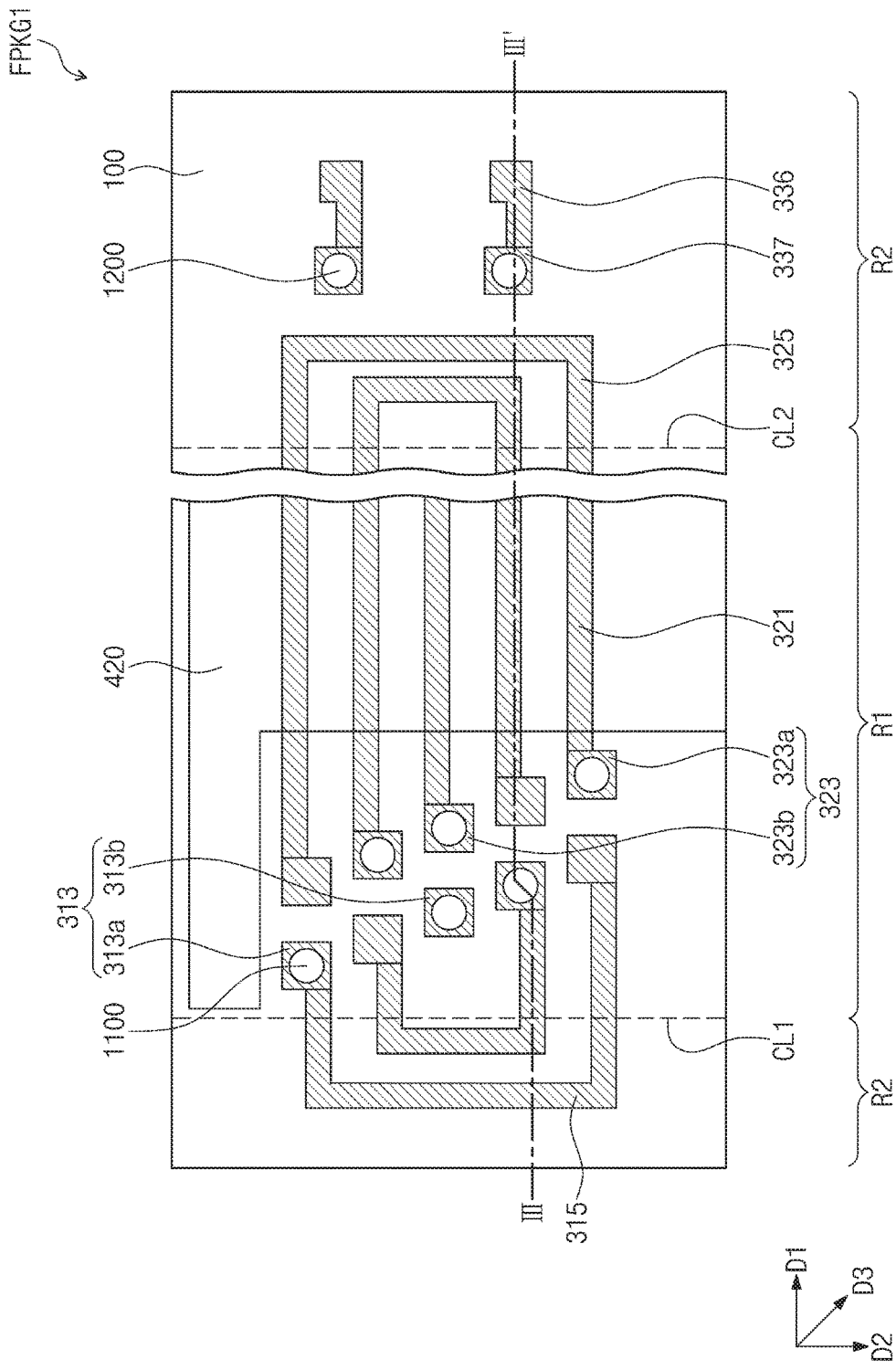
FIG. 3A is a plan view illustrating a method of testing a film package according to some embodiments of the inventive concepts.
Figure 3B:
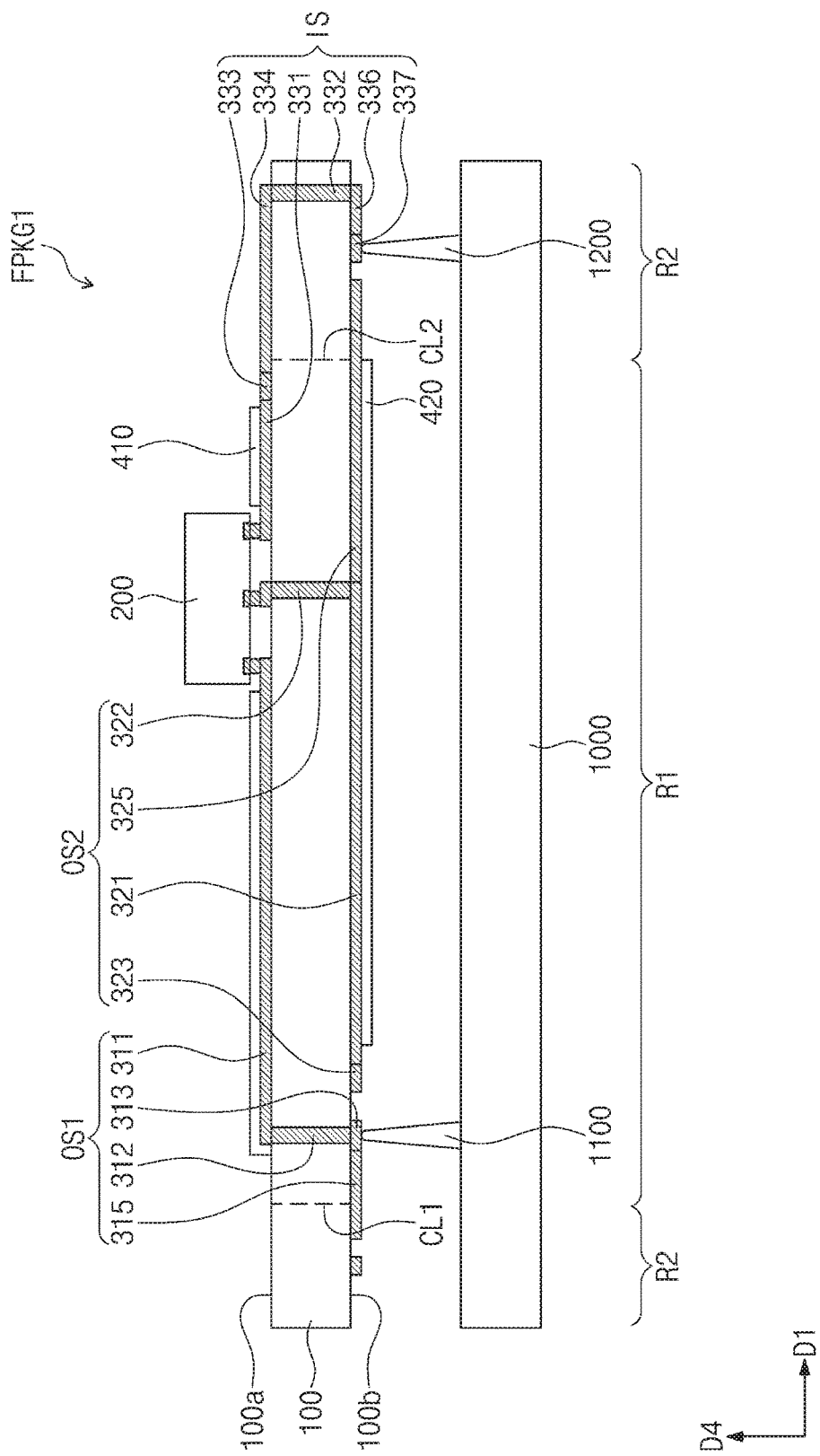
FIG. 3B is a cross-sectional view illustrating a method of testing a film package according to some embodiments of the inventive concepts.

FIG. 3A is an enlarged view of a portion of the film package of FIG. 2C to illustrate a method of testing a film package according to some embodiments of the inventive concepts. FIG. 3B is a cross-sectional view corresponding to a line III-III' of FIG. 3A to illustrate a method of testing a film package according to some embodiments of the inventive concepts. Hereinafter, the descriptions to the same elements as mentioned above will be omitted or mentioned briefly for the purpose of ease and convenience in explanation.

Referring to FIGS. 2C, 3A, and 3B, electrical connection of the film package FPKG1 may be tested using a test apparatus 1000. Here, the film package FPKG1 may be the same as described with reference to FIGS. 2C and 2D. A process of testing the film package FPKG1 may be performed after the semiconductor chip 200 is mounted on the film substrate 100. The test apparatus 1000 may include at least one output probe 1100 and at least one input probe 1200. The input probe 1200 may come in contact with the input test pads 337. As illustrated in FIG. 3B, the input test pads 337 may be electrically connected to the input pads 333 through the second input test lines 336, the input vias 332, and the first input test lines 334, respectively. The input probe 1200 may come in contact with the input test pads 337 to test electrical connection between the semiconductor chip 200 and the input pads 333. The tests of the electrical connection/electrical characteristics may include an electrical short test and/or a disconnection test.

The output pads 313 and 323 may function as test pads. For example, the output probe 1100 may come in contact with the second sub-output pad 313b to test electrical connection between the semiconductor chip 200 and the second sub-output pad 313b. The output probe 1100 may come in contact with the fourth sub-output pad 323b to test electrical connection between the semiconductor chip 200 and the fourth sub-output pad 323b. One or some of the first sub-output pads 313a and one or some of the third sub-output pads 323a may function as test pads, as described later. Thus, the size of the film package FPKG1 may be reduced.

The output probe 1100 may come in contact with one of the first sub-output pads 313a. The one first sub-output pad 313a may function as a test pad and may be electrically connected to another of the first sub-output pads 313a through the first merging line 315. The test apparatus 1000 may test electrical characteristics between the one first sub-output pad 313a and the semiconductor chip 200 and between the another first sub-output pad 313a and the semiconductor chip 200 through the output probe 1100. For example, the semiconductor chip 200 may not be electrically connected to the another first sub-output pad 313a by an inner circuit of the semiconductor chip 200 while testing electrical connection between the one first sub-output pad 313a and the semiconductor chip 200 through the output probe 1100. When the electrical characteristic test between the semiconductor chip 200 and the one first sub-output pad 313a is completed, the one first sub-output pad 313a may be electrically disconnected from the semiconductor chip 200 by the inner circuit of the semiconductor chip 200, and the another first sub-output pad 313a may be electrically connected from the semiconductor chip 200 by the inner circuit of the semiconductor chip 200. The test apparatus 1000 may test electrical connection between the another first sub-output pad 313a and the semiconductor chip 200 through the output probe 1100, the one first sub-output pad 313a, the first merging line 315, and the another first sub-output pad 313a. The number of the output probes 1100 coming in contact with the first sub-output pads 313a may be less than the number of the first sub-output pads 313a. As described with reference to the first sub-output pads 313a, the output probe 1100 may come in contact with one of the third sub-output pads 323a to test electrical characteristics between the semiconductor chip 200 and a plurality of third sub-output pads 323a. At this time, the one third sub-output pad 323a may function as a test pad. The number of the output probes 1100 coming in contact with the third sub-output pads 323a may be less than the number of the third sub-output pads 323a.

The probes 1100 and 1200 may be spaced apart from each other by specific pitches. The input probes 1200 (or the input test pads 337) may be spaced apart from each other by a relatively wide pitch. The output probe 1100 may be provided in plurality. If the output pads 313 and 323 are in contact with the output probes 1100 in one-to-one correspondence, a pitch of the output pads 313 and 323 should be substantially equal to a pitch of the output probes 1100. In this case, a size of the film package FPKG1 may be increased. However, according to some embodiments of the inventive concepts, it is possible to reduce the number of the output probes 1100 for testing the electrical characteristics of the film package FPKG1. For example, the total number of the output probes 1100 may be less than the total number of the output pads 313 and 323. Thus, limitations on the pitch of the output probes 110 and the pitch of the output pads 313 and 323 may be reduced or minimized to reduce the size of the film package FPKG1.

In addition, sizes of the output pads 313 and 323 and sizes of the input test pads 337 may be increased to prevent contact errors between the output probes 1100 and the output pads 313 and 323 and between the input probes 1200 and the input test pads 337. According to some embodiments of the inventive concepts, even though the first and second output pads 313 have relatively great sizes, the size of the film package FPKG1 may not be increased since the first and second output pads 313 and 323 are not arranged in the first direction D1 and the second direction D2.

The first output pads 313 and the second output pads 323, and the input test pads 337 may be disposed on the second surface 100b of the film substrate 100 as illustrated in FIG. 3B, and thus the probes 1100 and 1200 may come in contact with the pads 313, 323, and 337 at substantially the same time. Thus, the electrical characteristics of the film package FPKG1 may be quickly and simply tested. According to some embodiments of the inventive concepts, the output pads 313 and 323 may be exposed by the lower protection layer 420, and thus the output probes 1100 may come in contact with the output pads 313 10 and 323.

Figure 4A:
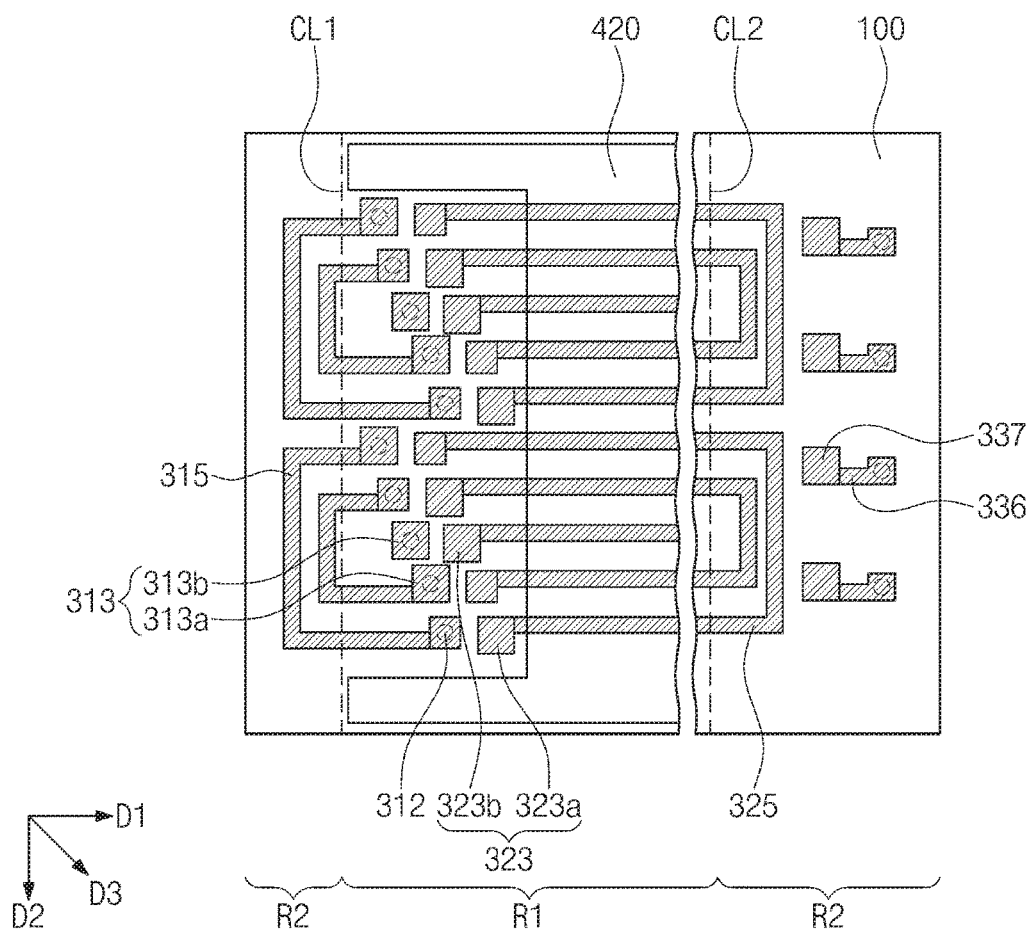
FIG. 4A is an enlarged plan view illustrating a portion of a film package according to some embodiments of the inventive concepts.
Figure 4B:
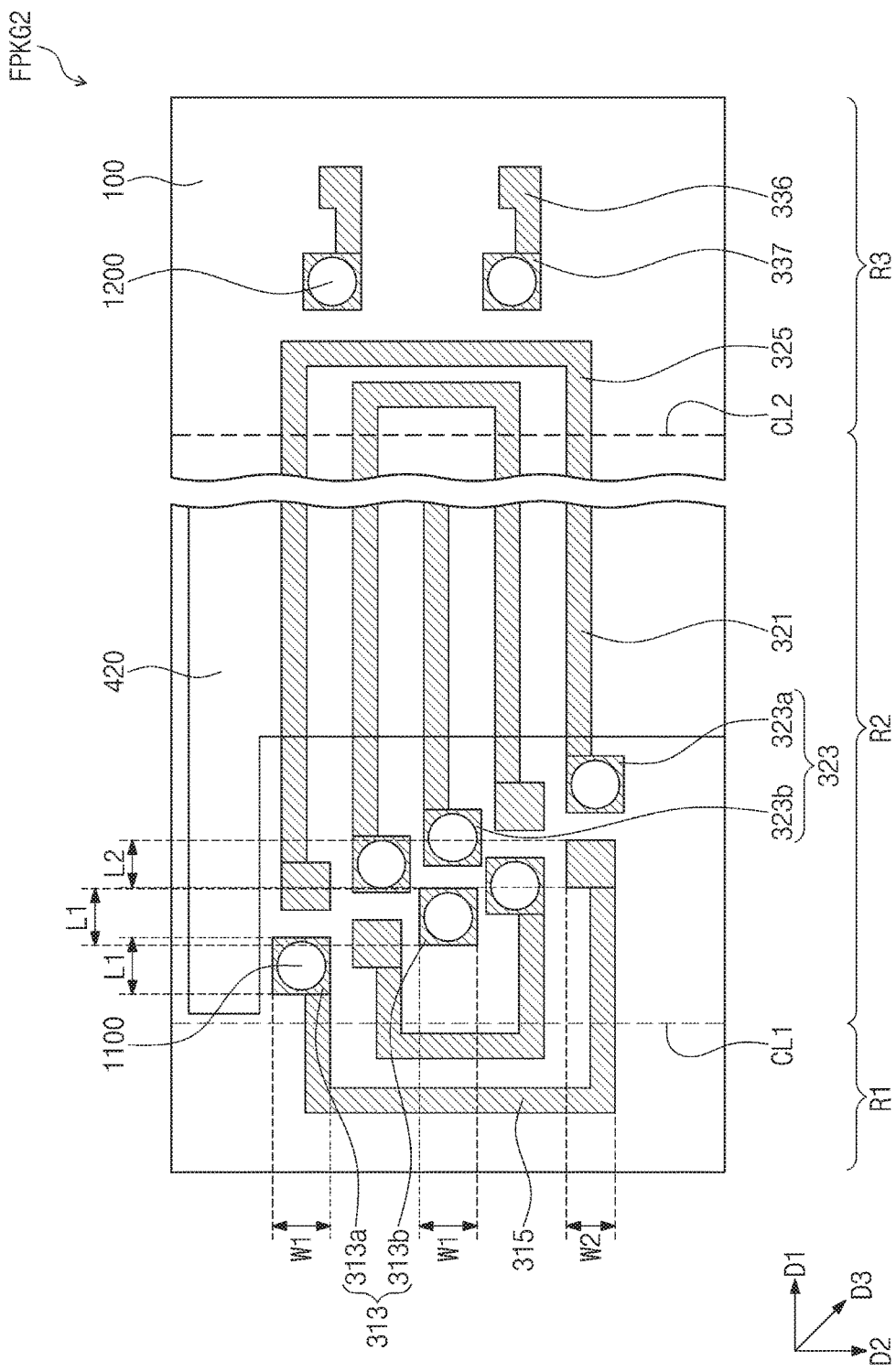
FIG. 4B is a plan view illustrating a method of testing the film package of FIG. 4A.

FIG. 4A is an enlarged plan view illustrating a portion of a film package according to some embodiments of the inventive concepts. FIG. 4B is an enlarged view of a portion of FIG. 4A to illustrate a method of testing the film package of FIG. 4A. Hereinafter, the descriptions to the same elements as mentioned above will be omitted or mentioned briefly for the purpose of ease and convenience in explanation.

Referring to FIGS. 4A and 4B, a film package FPKG2 may include a film substrate 100, a first output structure OS1, a second output structure OS2, and an input structure IS.

One or some of output pads 313 and 323 may have a different size from another or others of the output pads 313 and 323. Sizes of the output pads 313 and 323 coming in contact with the output probes 1100 may be greater than those of the output pads 313 and 323 not coming in contact with the output probes 1100. For example, a length L1 of one of the first sub-output pads 313a may be greater than a length L2 of another of the first sub-output pads 313a, to which it is electrically connected for example. A width W1 of the one first sub-output pad 313a may be greater than a width W2 of the another first sub-output pad 313a, to which it is electrically connected for example. At this time, the one first sub-output pad 313a may be connected to the another first sub-output pad 313a through the first merging line 315. A length L1 and a width W1 of the second sub-output pad 313b may be substantially equal to the length L1 and the width W1 of the one first sub-output pad 313a, respectively; however, example embodiments are not limited to this. The length L1 of the second sub-output pad 313b may be greater than the length L2 of the another first sub-output pad 313a. The width W1 of the second sub-output pad 313b may be greater than the width W2 of the another first sub-output pad 313a. Likewise, a size of one of the third sub-output pads 323a may be greater than a size of another of the third sub-output pads 323a, and the one third sub-output pad 323a may be connected to the another third sub-output pad 323a through the second merging line 325. A size of the fourth sub-output pad 323b may be greater than the size of the another third sub-output pad 323a.

Since the output pads 313 and 323 coming in contact with the output probes 1100 have relatively great sizes, the output probes 1100 may easily come in contact with the output pads 313 and 323. In addition, the output pads 313 and 323 not coming in contact with the output probes 1100 may have relatively small sizes, and thus the size of the film substrate 100 may be reduced or minimized.

Meanwhile, sizes of the first output pads 313 not coming in contact with the output probes 1100 may be greater than the diameters of corresponding ones of the first output vias 312 of FIG. 4A.

Figure 5A:
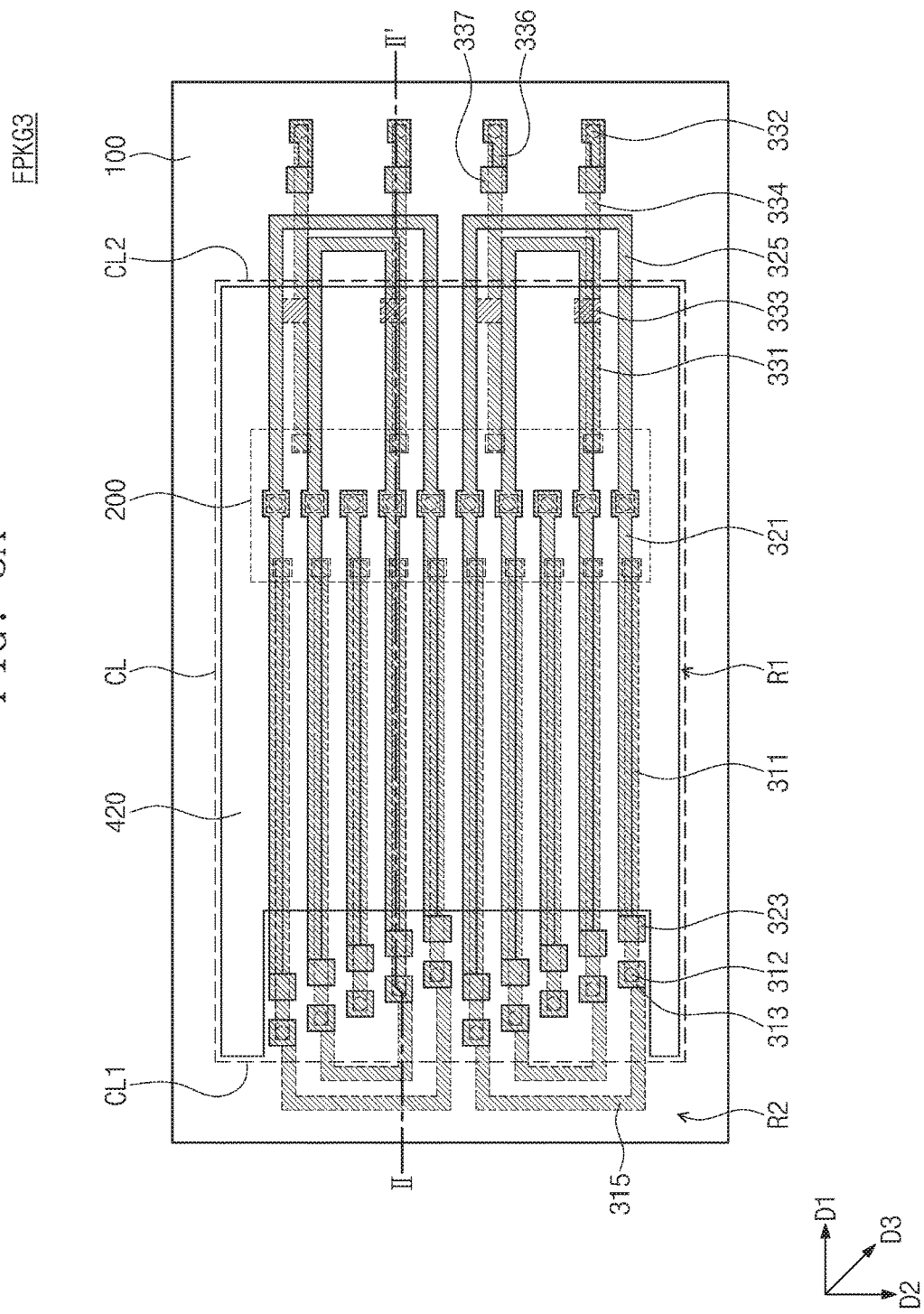
FIG. 5A is a plan view illustrating a film package according to some embodiments of the inventive concepts.
Figure 5B:
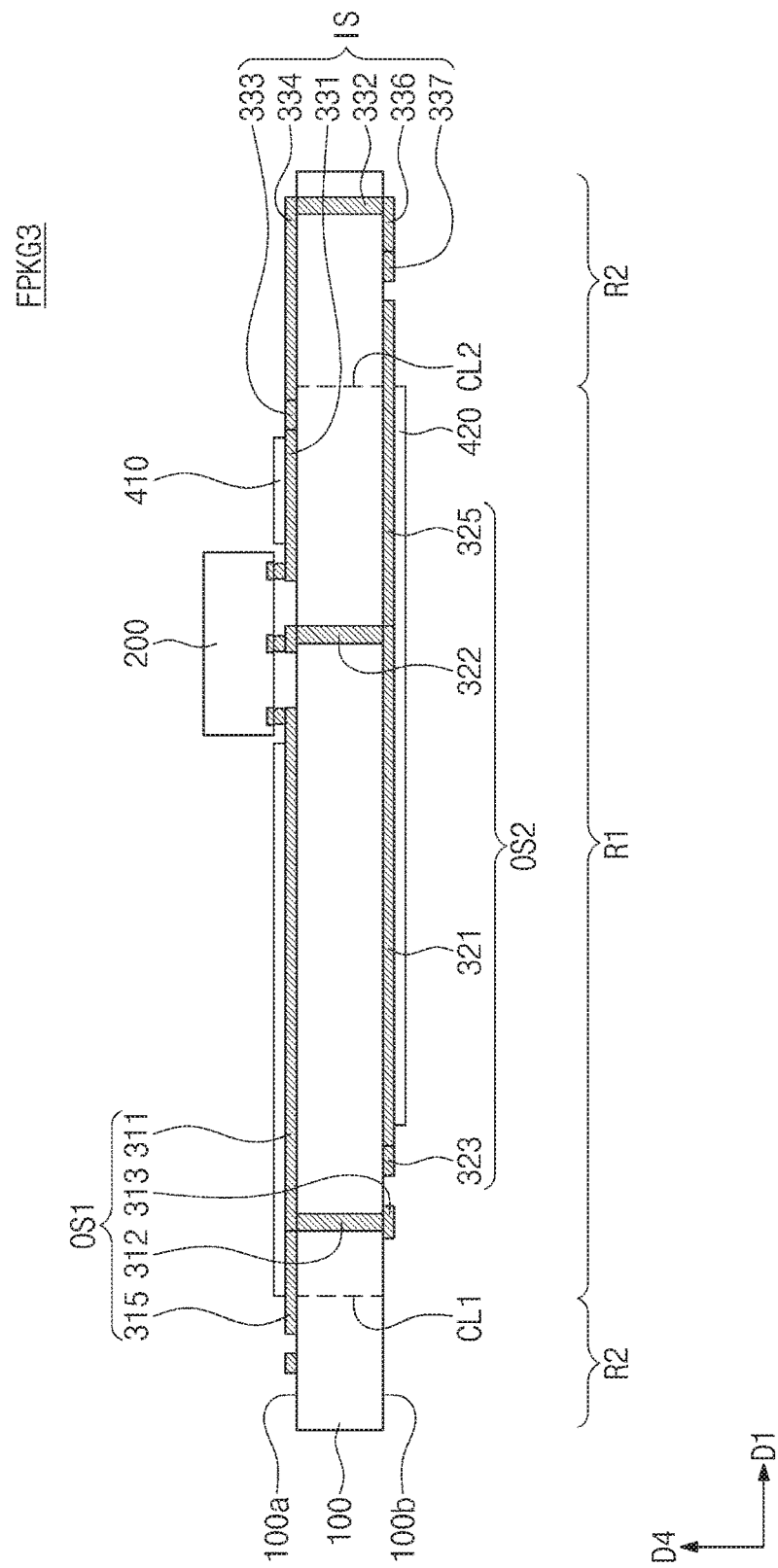
FIG. 5B is a cross-sectional view taken along a line II-II' of FIG. 5A.

FIG. 5A is an enlarged plan view corresponding to the region I of FIG. 1 to illustrate a film package according to some embodiments of the inventive concepts. FIG. 5B is a cross-sectional view taken along a line II-II' of FIG. 5A. Hereinafter, the descriptions to the same elements as mentioned above will be omitted or mentioned briefly for the purpose of ease and convenience in explanation.

Referring to FIGS. 5A and 5B, a film package FPKG3 may include a film substrate 100, a first output structure OS1, a second output structure OS2, an input structure IS, and a semiconductor chip 200. The second output structure OS2, the input structure IS, the input lines 331, the input vias 332, and the input pads 333 may be disposed at the same positions as described with reference to FIGS. 2A to 2D.

A first merging line 315 may be disposed on the first surface 100a of the film substrate 100. The first merging line 315 may extend from the first output vias 312 onto the second region R2 of the film substrate 100 through the first cut line CL1. The first merging line 315 may include a bent portion provided on the second region R2 of the film substrate 100. The first merging line 315 may be connected to a plurality of the first output vias 312. At least two of the first output pads 313 may be electrically connected to each other through the first merging line 315 and the first output vias 312.

Figure 6A:
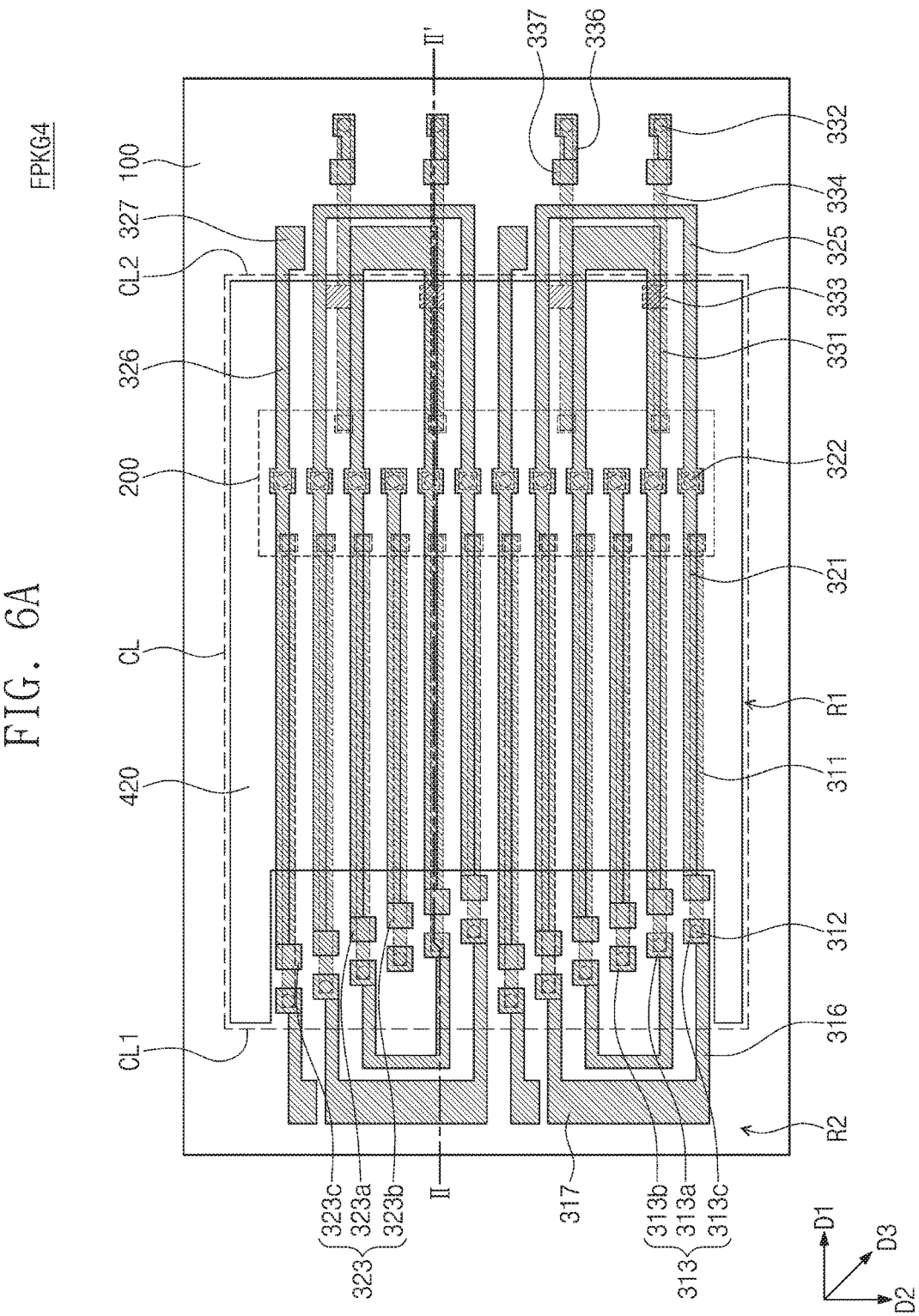
FIG. 6A is a plan view illustrating a film package according to some embodiments of the inventive concepts.
Figure 6B:
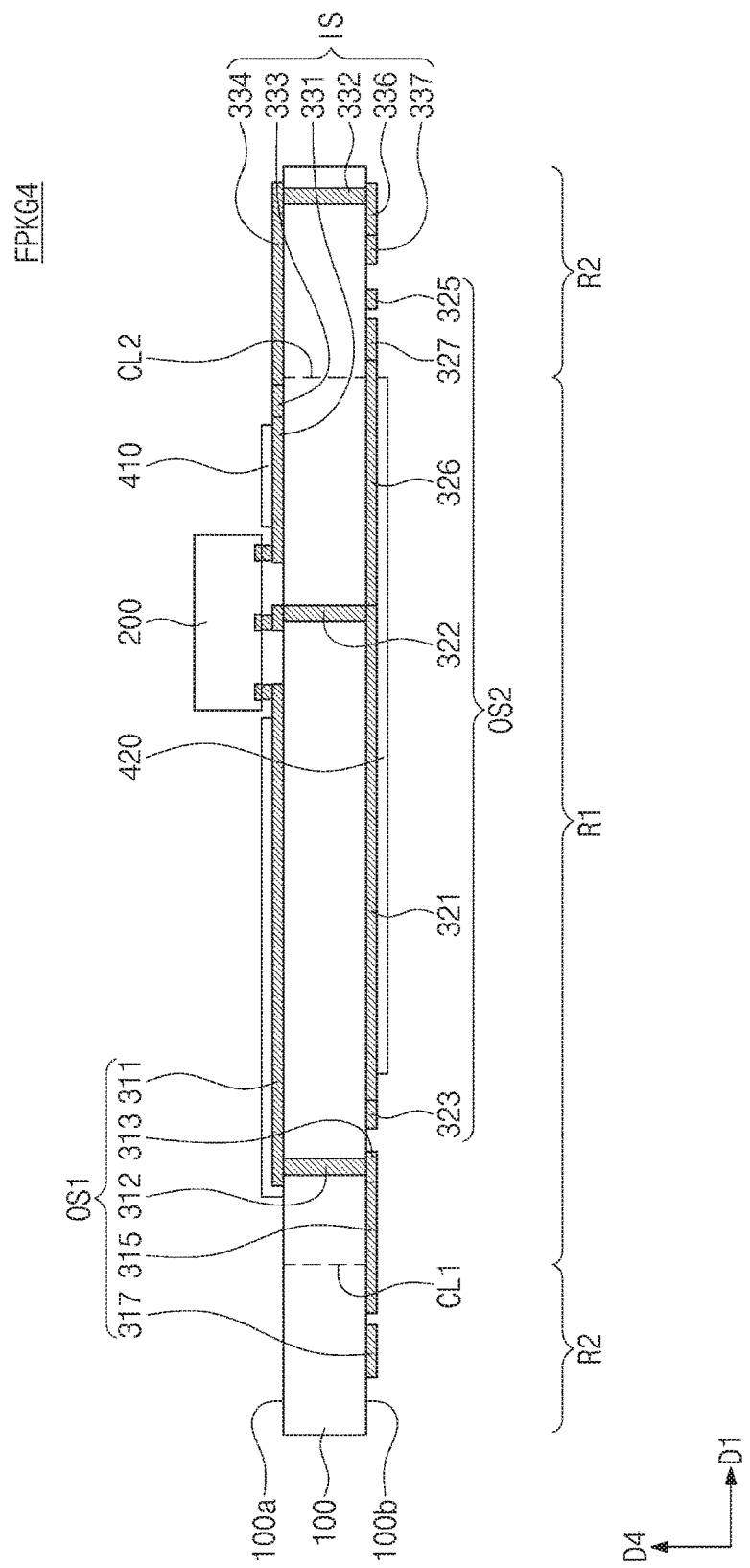
FIG. 6B is a cross-sectional view taken along a line II-II' of FIG. 6A.

FIG. 6A is an enlarged plan view corresponding to the region I of FIG. 1 to illustrate a film package according to some embodiments of the inventive concepts. FIG. 6B is a cross-sectional view taken along a line II-II' of FIG. 6A. Hereinafter, the descriptions to the same elements as mentioned above will be omitted or mentioned briefly for the purpose of ease and convenience in explanation.

Referring to FIGS. 6A and 6B, a film package FPKG4 may include a film substrate 100, a first output structure OS1, a second output structure OS2, an input structure IS, and a semiconductor chip 200. The semiconductor chip 200 may be mounted on the first surface 100a of the first region R1 of the film substrate 100. The first merging line 315 and the second merging line 325 may connect the first to fourth sub-output pads 313a, 313b, 323a, and 323b by the substantially same manner as described above.

A first output test pad 317 may be provided on the second surface 100b of the second region R2 of the film substrate 100 and may be adjacent to the first cut line CL1. First output test lines 316 may be provided on the second surface 100b of the film substrate 100. The first output test lines 316 may extend from the first output pads 313 onto the second region R2 through the first cut line CL when viewed from a plan view. The first output pads 313 may further include fifth sub-output pads 313c. The fifth sub-output pads 313c may be electrically connected to the first output test pad 317 through the first output test lines 316. A ratio of the number of the first output test pad 317 to the number of the fifth sub-output pad 313c may be 1:(1+a). Here, "a" denotes an integral number equal to or greater than 0. In some embodiments, the first output test pad 317 may be connected to one fifth sub-output pad 313c. In certain embodiments, the first output test pad 317 may be connected to two or more fifth sub-output pads 313c. The first sub-output pads 313a and the second sub-output pads 313b may not be connected to the first output test pad 317 and the first output test lines 316.

A second output test pad 327 may be provided on the second surface 100b of the second region R2 of the film substrate 100 and may be adjacent to the second cut line CL2. Second output test lines 326 may extend from the second output lines 321 onto the second region R2 through the second cut line CL2 when viewed from a plan view. The second output test pad 327 may be electrically connected to at least one of the second output vias 322 through at least one of the second output test lines 326. In some embodiments, the second output pads 323 may further include sixth sub-output pads 323c. The second output test pad 327 may be connected to at least one of the sixth sub-output pads 323c. The fourth sub-output pad 323b may not be connected to the second output test pad 327 and the second merging line 325. In certain embodiments, the fourth sub-output pad 323b may be omitted.

Figure 7B:
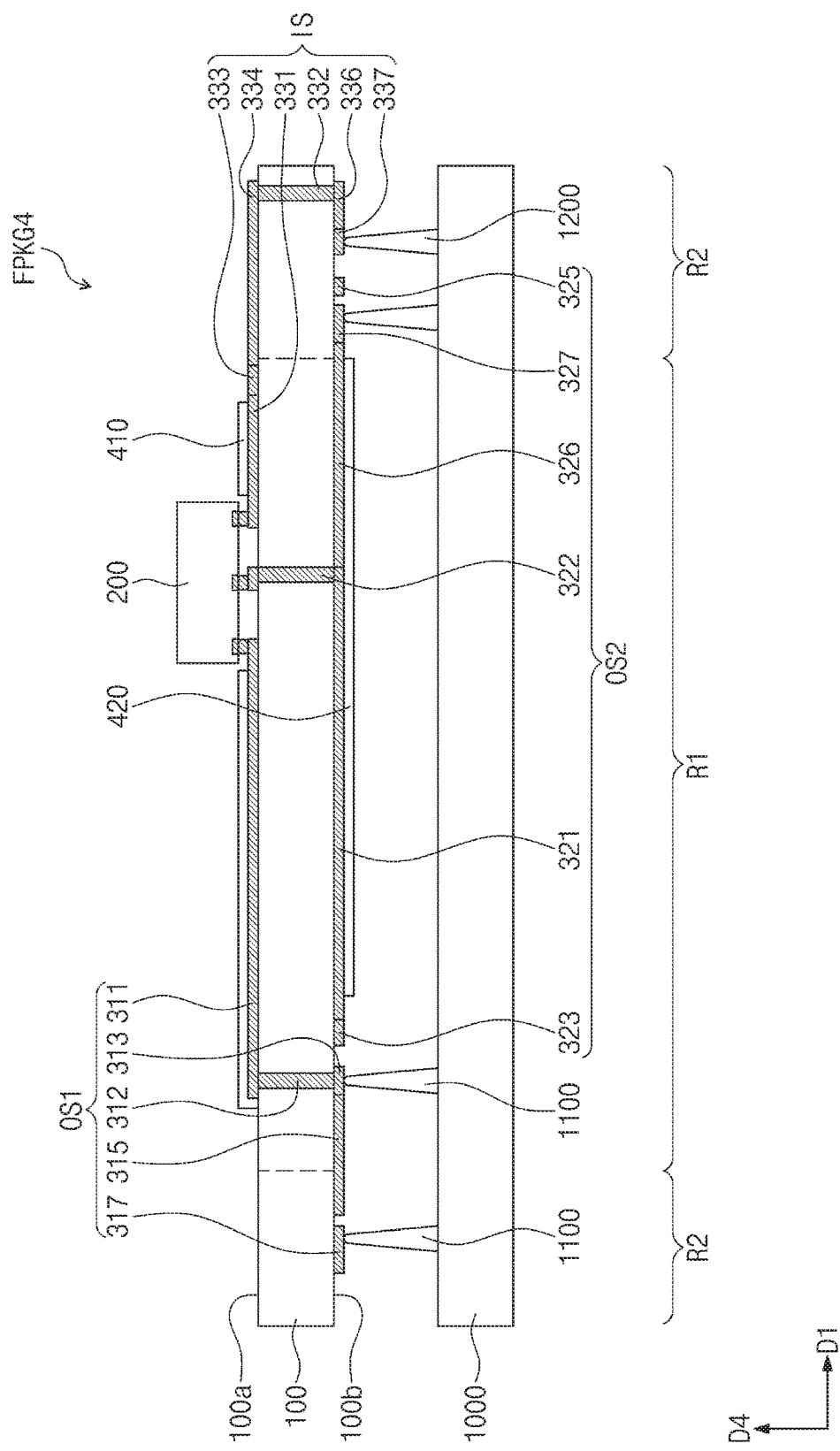
FIG. 7B is a cross-sectional view corresponding to a line III-III' of FIG. 7A to illustrate a method of testing a film package according to some embodiments of the inventive concepts.

FIG. 7A is an enlarged plan view of a portion of FIG. 6A to illustrate a method of testing a film package according to some embodiments of the inventive concepts. FIG. 7B is a cross-sectional view corresponding to a line III-III' of FIG. 7A to illustrate a method of testing a film package according to some embodiments of the inventive concepts. Hereinafter, the descriptions to the same elements as mentioned above will be omitted or mentioned briefly for the purpose of ease and convenience in explanation.

Referring to FIGS. 6A, 7A, and 7B, electrical connection of the film package FPKG4 described with reference to FIGS. 6A and 6B may be tested using a test apparatus 1000. The test apparatus 1000 may include at least one output probe 1100 and at least one input probe 1200. The output probes 1100 and the input probes 1200 may come in contact with the first to fourth sub-output pads 313a, 313b, 323a, and 323b and the input test pads 337, as described with reference to FIGS. 3A and 3B.

In addition, one of the output probes 1100 may come in contact with the first output test pad 317 to test electrical characteristics between the semiconductor chip 200 and the fifth sub-output pad 313c. For example, the output probe 1100 may come in contact with the first output test pad 317 to test electrical connection between the semiconductor chip 200 and at least two fifth sub-output pad 313c. One of the output probes 1100 may come in contact with the second output test pad 327 to test electrical characteristics between the semiconductor chip 200 and the sixth sub-output pad 323c. The output probe 1100 may be provided in plurality as described above. Since the first and second output test pads 317 and 327 are provided on the second region R2 of the film substrate 100, a pitch of the output probes 1100 can be increased. Thus, the electrical characteristics of the film package FPKG4 may be stably tested. Pitches of the output pads 313 and 323 may be less than the pitch of the output probes 1100. Thus, the size of the film package FPKG4 may be reduced.

The output test pads 317 and 327, the output pads 313 and 323, and the input test pads 337 may be provided on the second surface 100b of the film substrate 100, and thus the probes 1100 and 1200 may come in contact with the pads 317, 327, 313, 323, and 337 at the substantially same time. Thus, the electrical characteristics of the film package FPKG4 may be quickly tested.

Figure 8A:
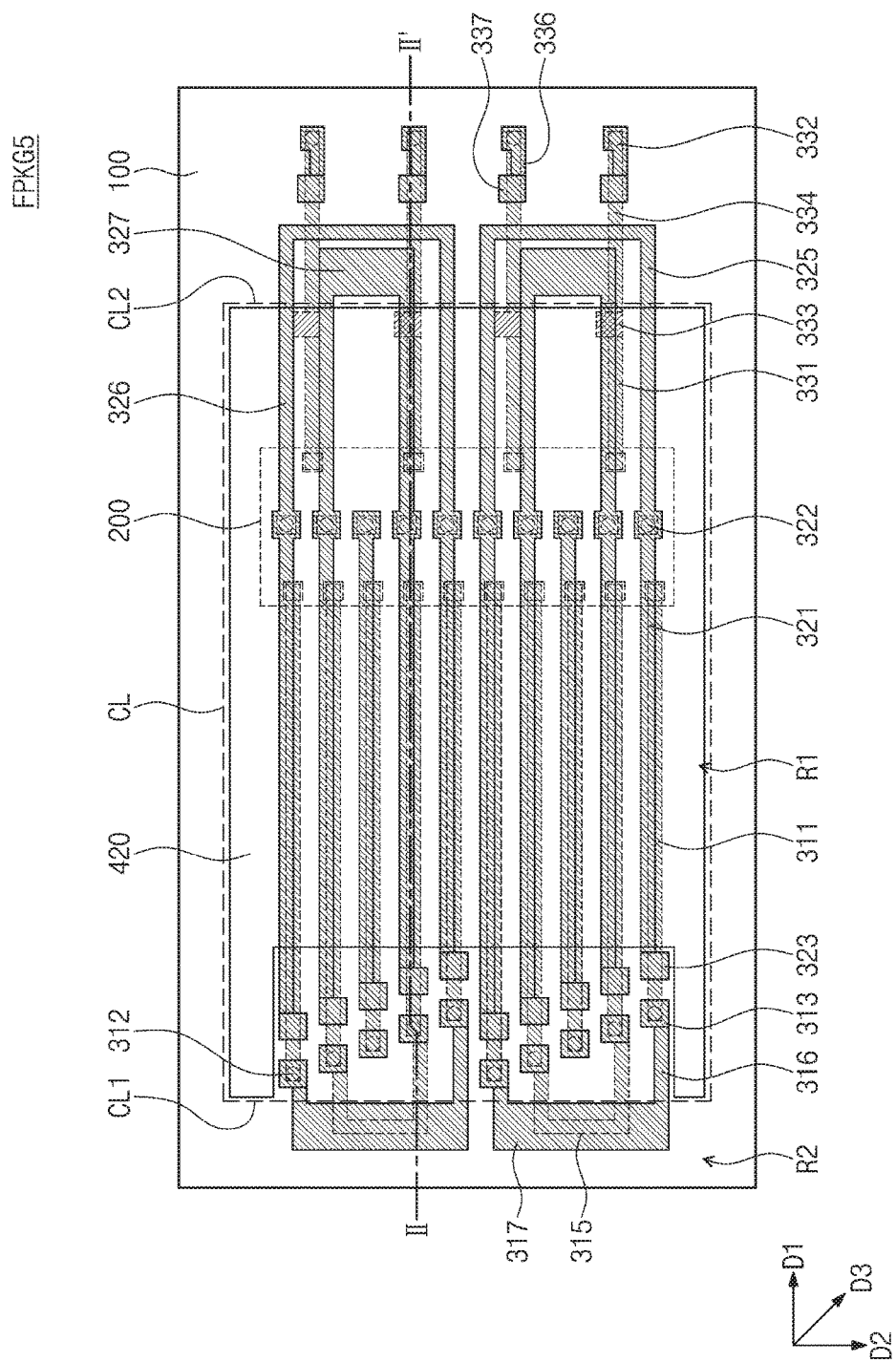
FIG. 8A is a plan view illustrating a film package according to some embodiments of the inventive concepts.
Figure 8B:
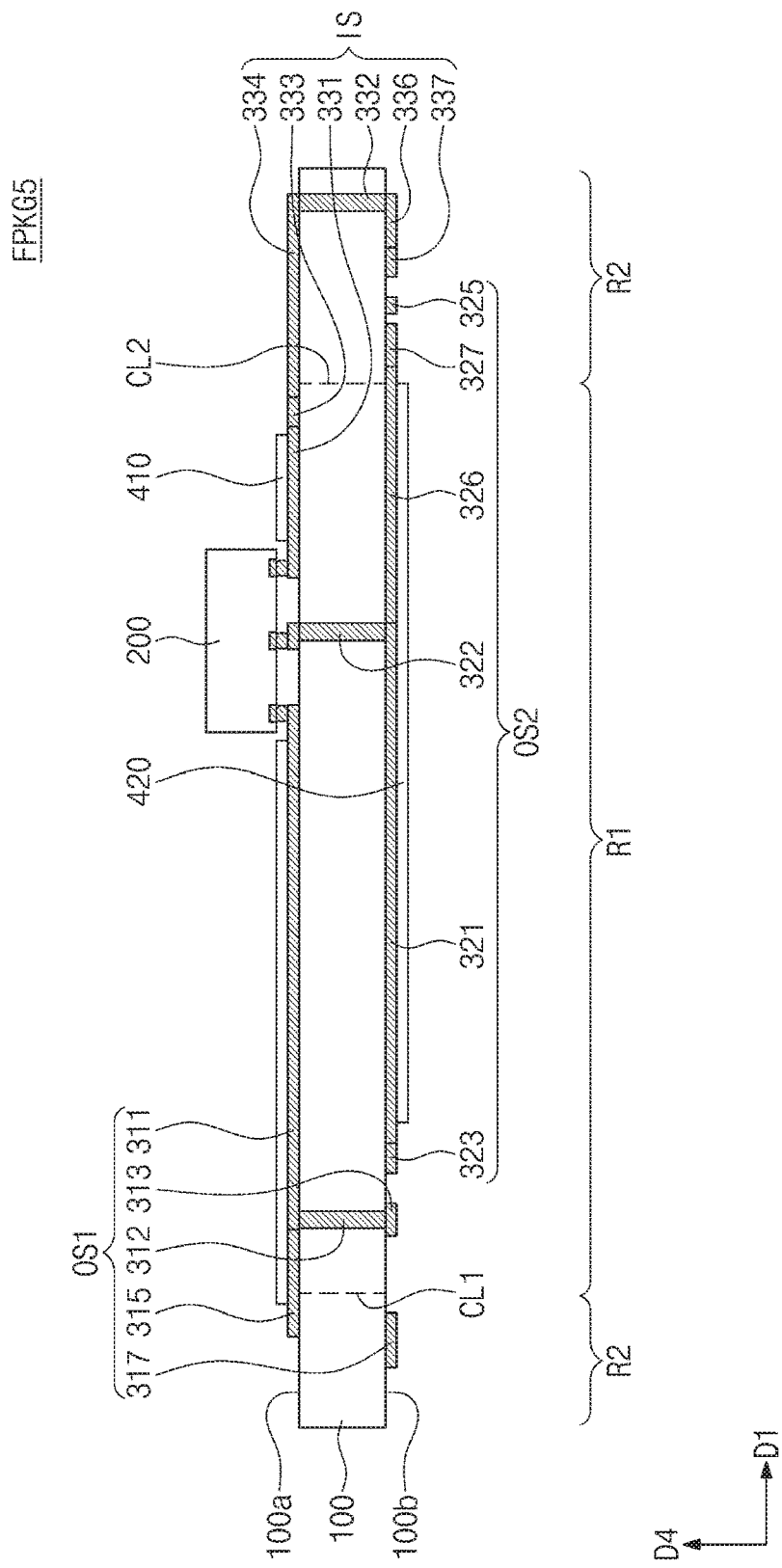
FIG. 8B is a cross-sectional view taken along a line II-II' of FIG. 8A.

FIG. 8A is an enlarged plan view corresponding to the region I of FIG. 1 to illustrate a film package according to some embodiments of the inventive concepts. FIG. 8B is a cross-sectional view taken along a line II-II' of FIG. 8A. Hereinafter, the descriptions to the same elements as mentioned above will be omitted or mentioned briefly for the purpose of ease and convenience in explanation.

Referring to FIGS. 8A and 8B, a film package FPKG5 may include a film substrate 100, a first output structure OS1, a second output structure OS2, an input structure IS, and a semiconductor chip 200. The semiconductor chip 200 may be mounted on the first surface 100a of the first region R1 of the film substrate 100. A first merging line 315 may be provided on the first surface 100a of the film substrate 100 and may be connected to at least two of the first output vias 312. The first merging line 315 may be electrically connected to at least two of the first output pads 313 through the first output vias 312. The first output test pad 317 and the first output test lines 316 may be provided on the second surface 100b of the second region R2 of the film substrate 100. The first merging line 315 may be spaced apart from the first output test lines 316 and the first output test pad 317 in the vertical direction D4. The first merging line 315 may partially overlap with the first output test lines 316 and the first output test pad 317 when viewed from a plan view. Thus, the size of film substrate 100 may be more reduced.

Figure 9A:
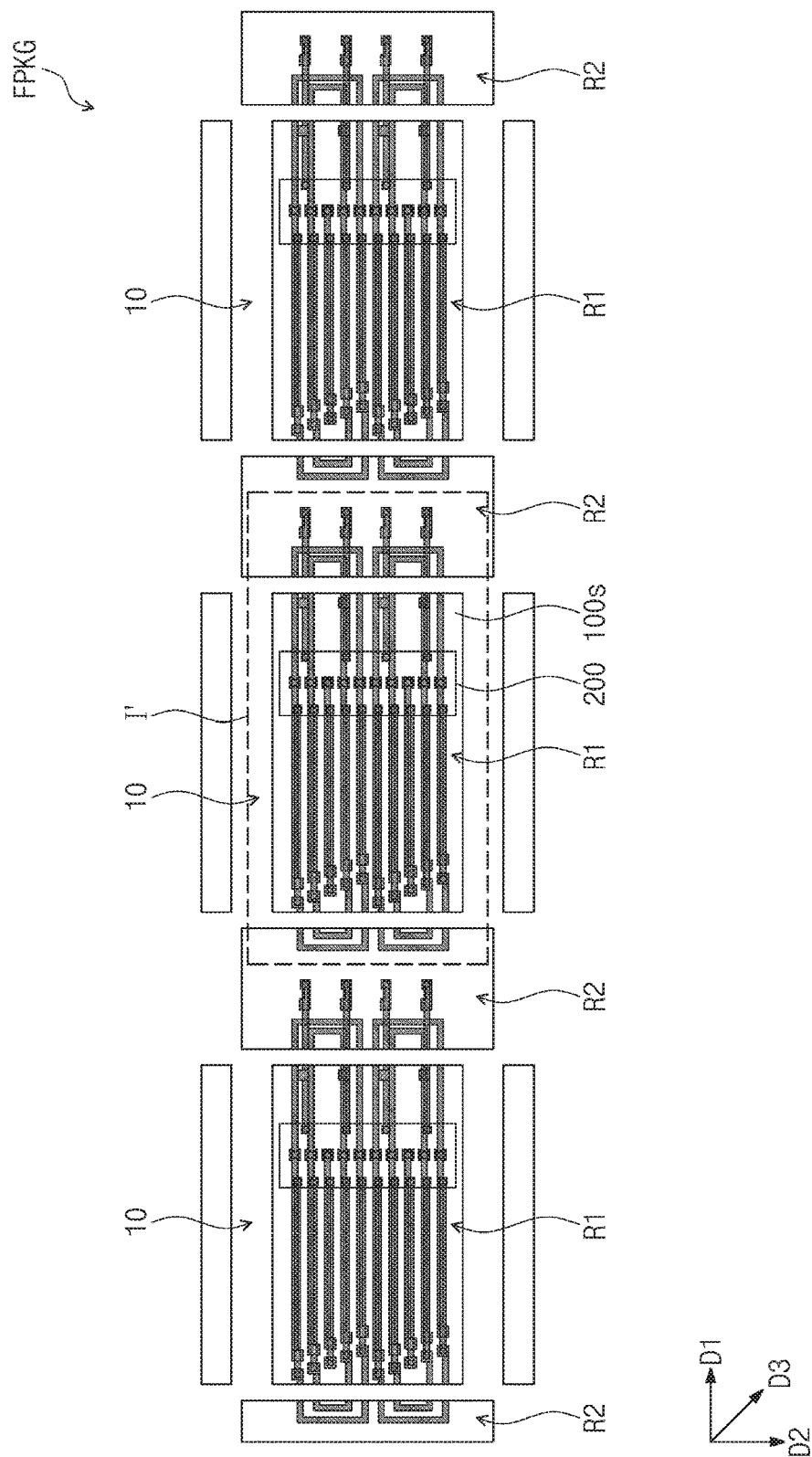
FIG. 9A is a plan view illustrating a method of manufacturing a semiconductor package according to some embodiments of the inventive concepts.
Figure 9B:
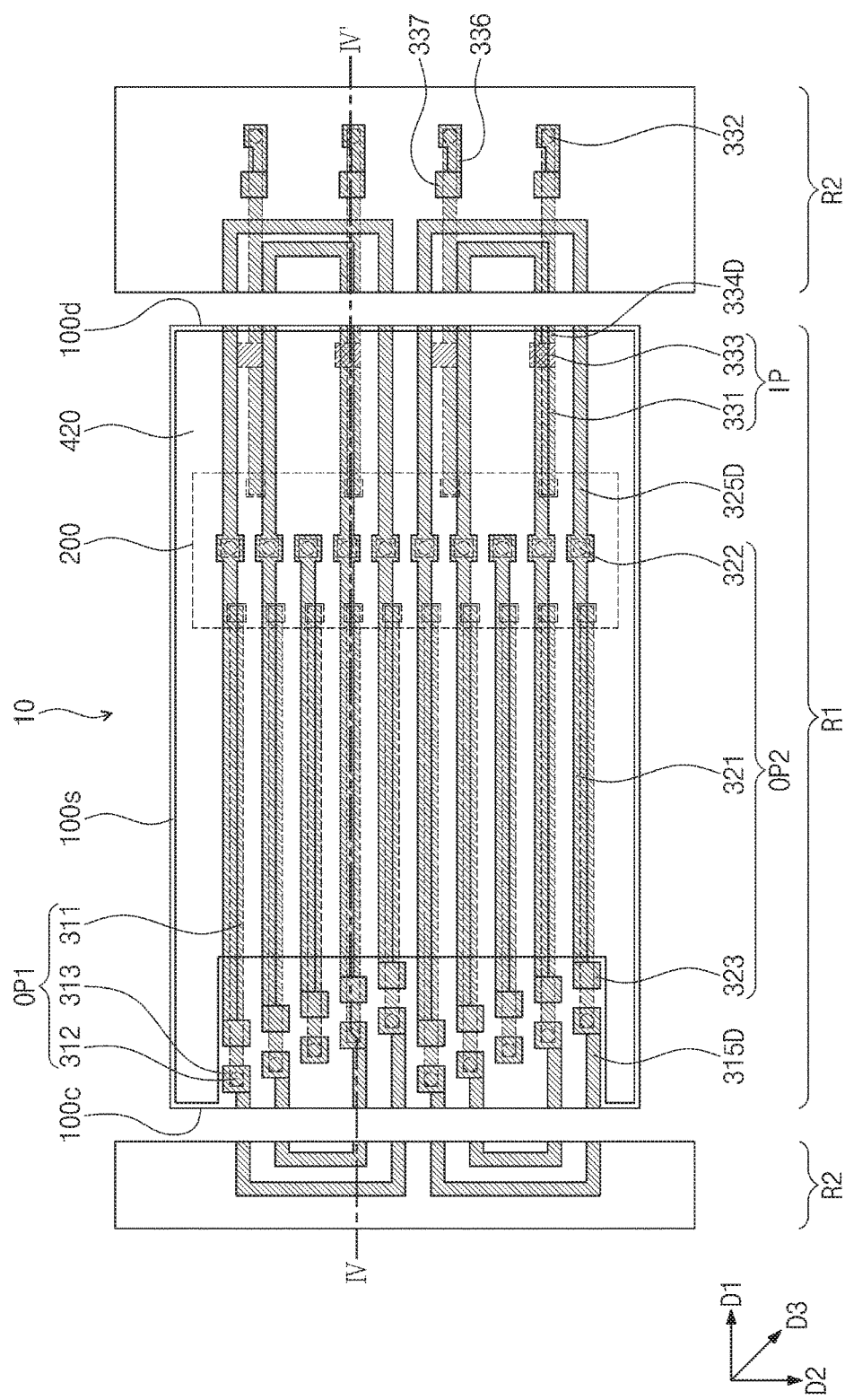
FIG. 9B is an enlarged view of a region I' of FIG. 9A.
Figure 9C:
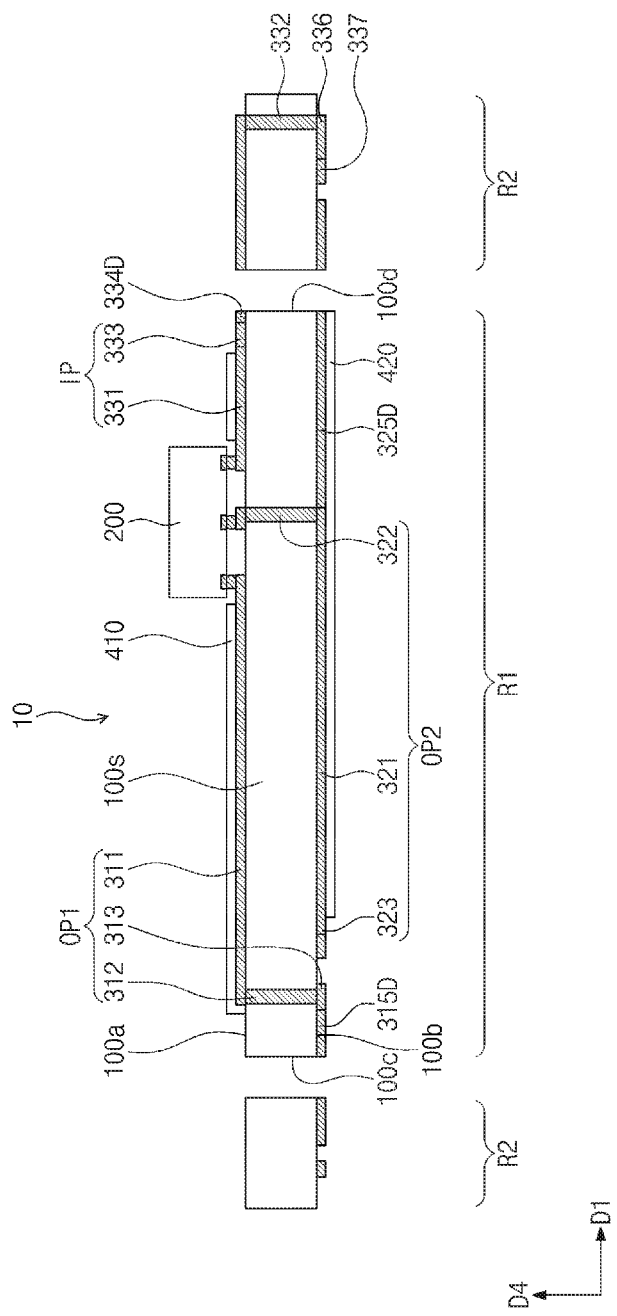
FIG. 9C is a cross-sectional view taken along a line IV-IV' of FIG. 9B.

FIG. 9A is a plan view illustrating a method of manufacturing a semiconductor package according to some embodiments of the inventive concepts. FIG. 9B is an enlarged view of a region I' of FIG. 9A. FIG. 9C is a cross-sectional view taken along a line IV-IV' of FIG. 9B. Hereinafter, the descriptions to the same elements as mentioned above will be omitted or mentioned briefly for the purpose of ease and convenience in explanation.

Referring to FIGS. 9A and 9B, first a film product is manufactured. Namely, a film substrate 100 is provided, and a metallization process conducted. The metallization process forms the input and output structures IS, OS1 and OS2 as well as the merge line structures. Next, film packages FPKG are formed by mounting semiconductor chips 200 on the first surface 100a of the film substrate 100.

Referring to FIGS. 2C and 9A to 9C, the film package FPKG may include a plurality of semiconductor packages 10. The film substrate 100 may be sawed along the cut line CL of FIG. 2C to separate the semiconductor packages 10 from each other. In some embodiments, one or more of the film packages may be the film package FPKG1 of FIGS. 2C and 2D, the film package FPKG2 of FIG. 4A and/or the film package FPKG3 of FIGS. 5A and 5B. Each of the semiconductor packages 10 may be a chip-on-film (COF) package. Each of the semiconductor packages 10 may include the semiconductor chip 200 mounted on the first region R1 of the film substrate 100. For example, the first regions R1 of the film substrate 100 may be separated from the second region R2 of the film substrate 100 by sawing the film substrate 100. The first regions R1 of the film substrate 100 may be included in the semiconductor packages 10, respectively. The first region R1 included in each of the semiconductor packages 10 is defined as a substrate 100s. The second region R2 of the film substrate 100 may be removed. Hereinafter, each of the semiconductor packages 10 will be described in detail.

Referring to FIGS. 2C, 9B, and 9C, one sidewall 100c and another sidewall 100d of the substrate 100s may be defined by the process of sawing the film substrate 100. The one sidewall 100c and the another sidewall 100d of the substrate 100s may respectively correspond to the first cut line CL1 and the second cut line CL2 of the film substrate 100 before the sawing process.

The first input test lines 334 of FIG. 2C may be sawed together with the film substrate 100. The first input test lines 334 disposed on the first region R1 of the film substrate 100 may be separated from the input test pads 337 and the input vias 332, thereby forming input dummy lines 334D. In other words, the input dummy lines 334 may correspond to the first input test lines 334 remaining on the substrate 100s of the semiconductor package 10 after the sawing process. The input dummy lines 334D may be connected to the input pads 333 and may be disposed between the another sidewall 100d of the substrate 100s and the input pads 333 when viewed from a plan view.

The first merging line 315 of FIG. 2C may be sawed together with the film substrate 100. The bent portion of the first merging line 315 may be provided on the second region R2 of the film substrate 100, and thus the bent portion may be separated from the semiconductor package 10 by the sawing process. Portions of the first merging line 315 which remain on the substrate 100s after the sawing process may be defined as first dummy lines 315D. The first dummy lines 315D may be connected to the first output pads 313 and may be disposed between the one sidewall 100c of the substrate 100s and the first output pads 313 when viewed from a plan view. Since the first dummy lines 315D are separated from the bent portion of the first merging line 315, the first output pads 313 may not be electrically connected to each other. The first dummy lines 315D may be spaced apart from each other in the second direction D2.

The second merging line 325 of FIG. 2C may also be sawed together with the film substrate 100, thereby forming second dummy lines 325D. In other words, the second dummy lines 325D may correspond to portions of the second merging line 325 which remain on the substrate 100s after the sawing process. The second dummy lines 325D may be connected to the second output lines 321 and may be disposed between the another sidewall 100d of the substrate 100s and the second output lines 321 when viewed from a plan view. The second dummy lines 325D may be separated from the bent portion of the second merging line 325, and thus the second output pads 323 of the semiconductor package 10 may be electrically insulated from each other.

The upper protection layer 410 may be disposed on the first surface 100a of the substrate 100s. The upper protection layer 410 may cover the first output lines 311 and the input lines 331 but may expose the input pads 333. The lower protection layer 420 may be disposed on the second surface 100b of the substrate 100s. The lower protection layer 420 may cover the second output lines 321 and the second dummy lines 325D but may expose the first and second output pads 313 and 323.

The semiconductor package 10 may include the substrate 100s, the semiconductor chip 200, a first output pattern OP1, a second output pattern OP2, and an input pattern IP. The first output pattern OP1 may include the first output lines 311, the first output vias 312, and the first output pads 313. The second output pattern OP2 may include the second output lines 321, the second output vias 322, and the second output pads 323. The input pattern IP may include the input lines 331 and the input pads 333.

Figure 10B:
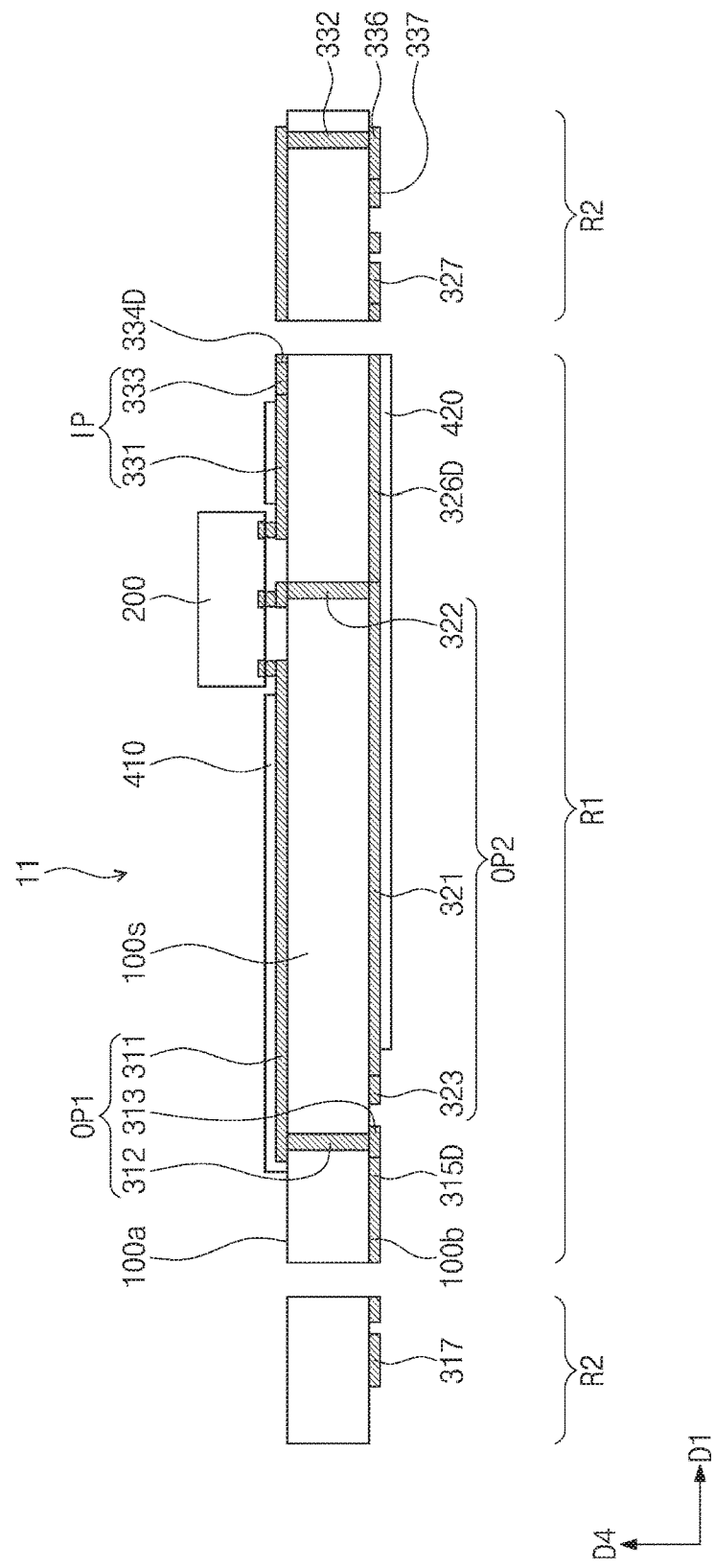
FIG. 10B is a cross-sectional view taken along a line IV-IV' of FIG. 10A.

FIG. 10A is an enlarged plan view corresponding to the region I' of FIG. 9A to illustrate a method of manufacturing a semiconductor package according to some embodiments of the inventive concepts. FIG. 10B is a cross-sectional view taken along a line IV-IV' of FIG. 10A. Hereinafter, the descriptions to the same elements as mentioned above will be omitted or mentioned briefly for the purpose of ease and convenience in explanation.

Referring to FIGS. 6A, 6B, 10A, and 10B, the film package 100 of the film package may be sawed along the cut line CL to separate semiconductor packages 11 from each other. In some embodiments, one or more of the film packages may be the film package FPKG4 of FIGS. 6A and 6B, and/or the film package FPKG5 of FIGS. 8A and 8B. The semiconductor package 11 may include the substrate 100s, the semiconductor chip 200, a first output pattern OP1, a second output pattern OP2, an input pattern IP, input dummy lines 334D, first dummy lines 315D and 316D, and second dummy lines 325D and 326D. As described above, the substrate 100s may correspond to the first region R1 of the film substrate 100, which is included in the semiconductor package 11 after the sawing process. For example, the first input test lines 334 of FIGS. 6A and 6B may be sawed together with the film substrate 100 to form the input dummy lines 334D.

The first output test lines 316 and the first merging line 315 of FIGS. 6A and 6B may be sawed together with the film substrate 100 to form the first dummy lines 315D and 316D. The first dummy lines 315D and 316D may be connected to the first output pads 313 and may be disposed between the one sidewall 100c of the substrate 100s and the first output pads 313 when viewed from a plan view. The first dummy lines 315D and 316D may be separated from the bent portion of the first merging line 315 and the first output test pad 317 by the sawing process. Thus, the first output pads 313 may not be electrically connected to each other.

The second output test lines 326 and the second merging line 325 of FIGS. 6A and 6B may be sawed together with the film substrate 100 to form the second dummy lines 325D and 326D. The second dummy lines 325D and 326D may be separated from the bent portion of the second merging line 325 and the second output test pad 327 by the sawing process. Thus, the second output pads 323 may not be electrically connected to each other.

Figure 11A:
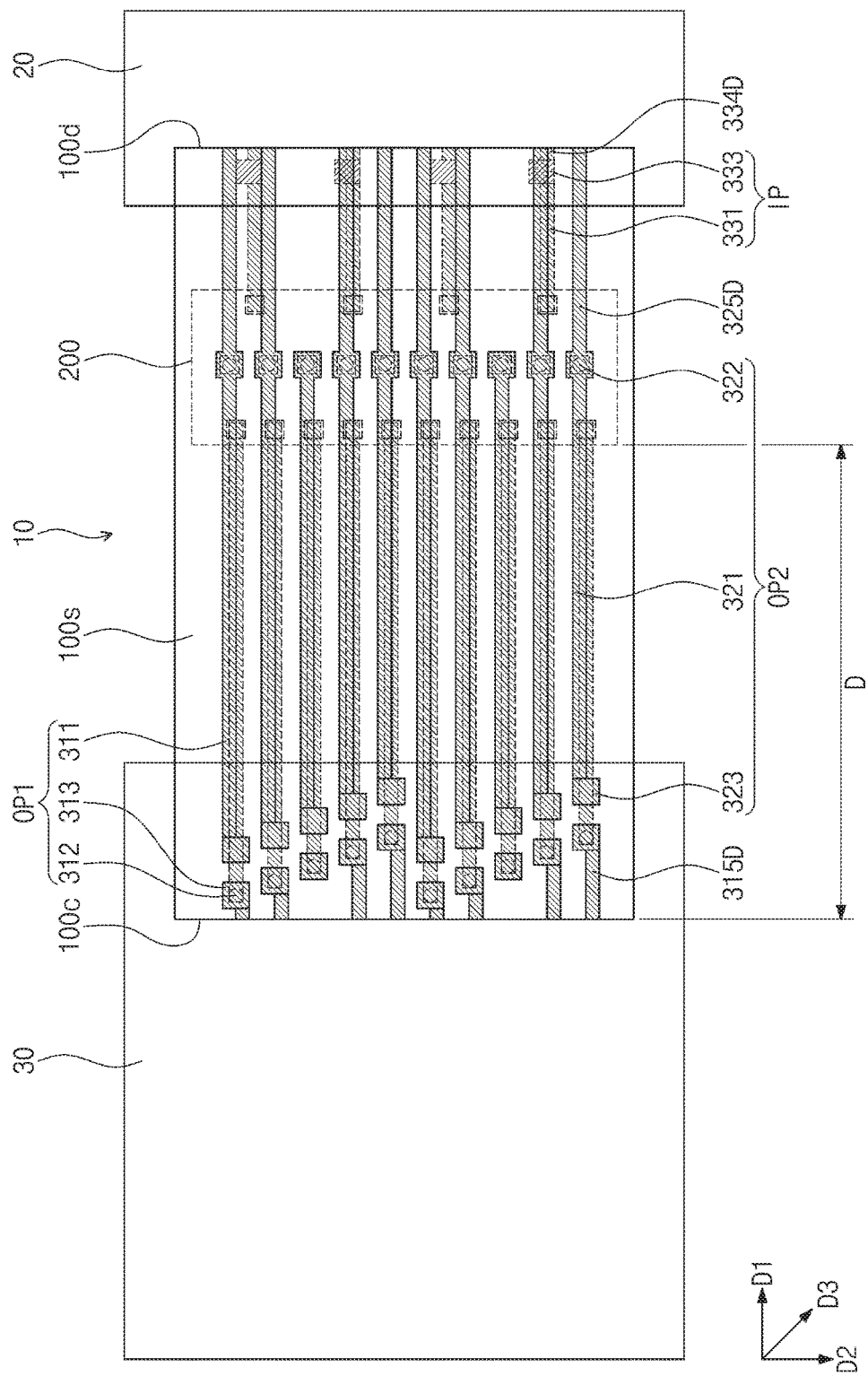
FIG. 11A is a plan view illustrating a package module according to some embodiments of the inventive concepts.
Figure 11B:
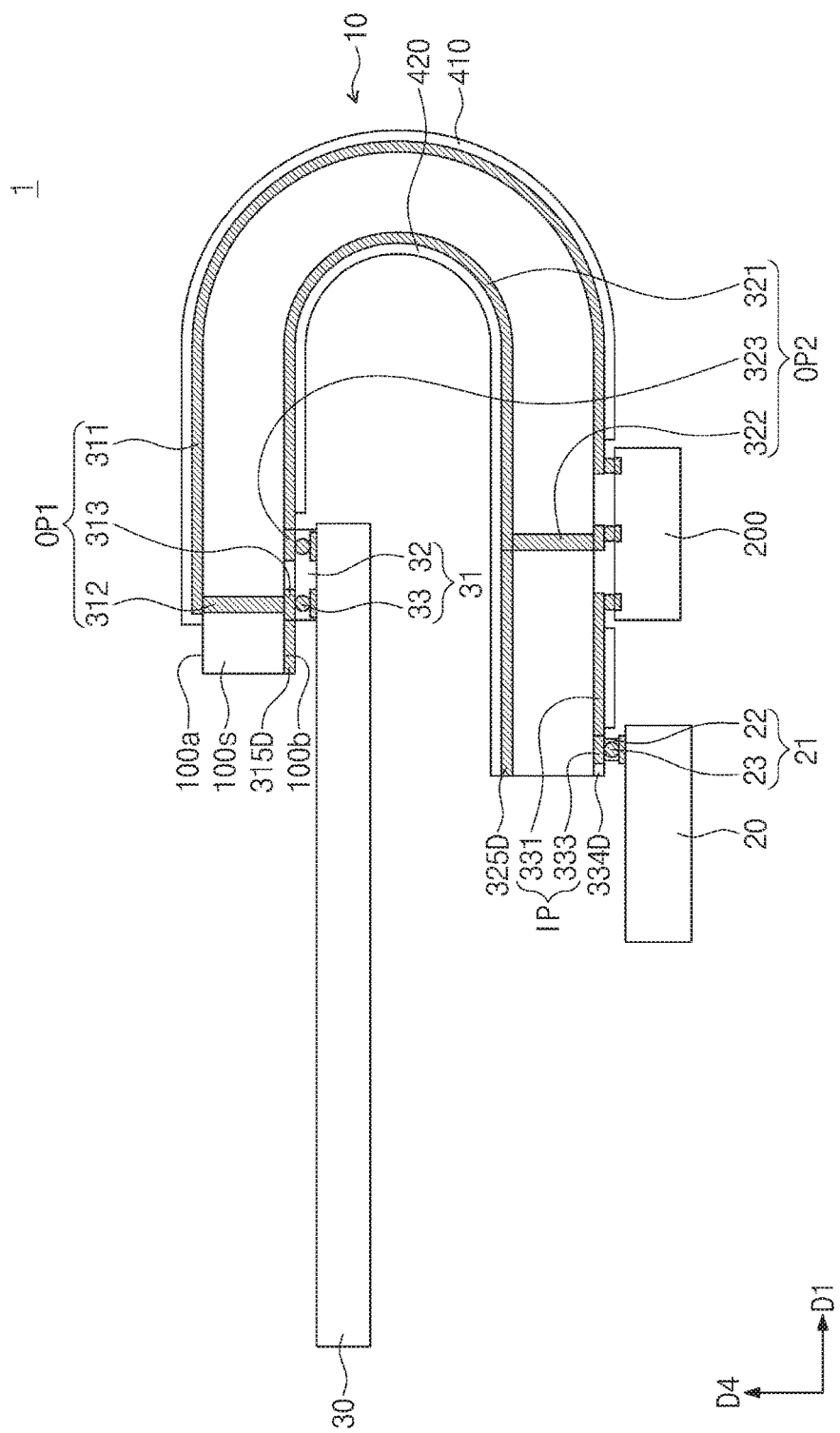
FIG. 11B is a cross-sectional view illustrating a package module according to some embodiments of the inventive concepts.
Figure 11C:
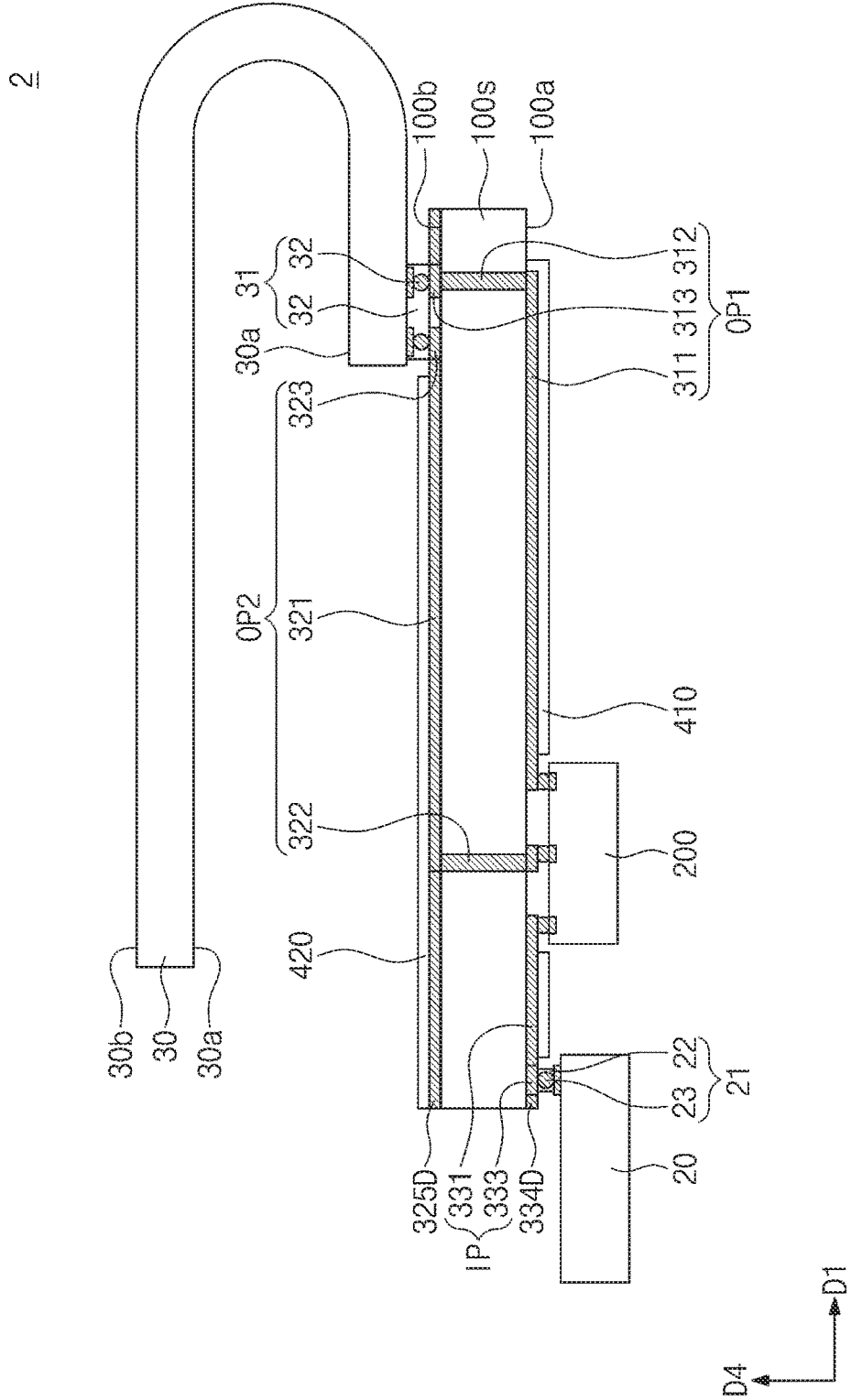
FIG. 11C is a cross-sectional view illustrating a package module according to some embodiments of the inventive concepts.

FIG. 11A is a plan view illustrating a package module according to some embodiments of the inventive concepts before the package module is bent. FIG. 11B is a cross-sectional view illustrating a package module according to some embodiments of the inventive concepts. FIG. 11C is a cross-sectional view illustrating a package module according to some embodiments of the inventive concepts. Hereinafter, the descriptions to the same technical features as mentioned above will be omitted or mentioned briefly for the purpose of ease and convenience in explanation.

Referring to FIGS. 11A to 11C, a circuit substrate 20 and a display device 30 may be mounted on or connected to the first surface 100a and the second surface 100b of the substrate 100s, thereby manufacturing a package module 1 or 2. In other words, the package module 1 or 2 may include the semiconductor package 10, the circuit substrate 20, and the display device 30. In some embodiments, the semiconductor package 10 of FIGS. 9B and 9C may be included in the package module 1 or 2. The semiconductor package 10 may include the substrate 100s, the semiconductor chip 200, the first output pattern OP1, the second output pattern OP2, the input pattern IP, the input dummy lines 334D, the first dummy lines 315D, and the second dummy lines 325D. In certain embodiments, the semiconductor package 11 of FIGS. 10A and 10B may be included in the package module 1 or 2. In some embodiments, the package module 1 or 2 may be a display device assembly.

The circuit substrate 20 may be disposed to be adjacent to the another sidewall 100d of the substrate 100s. The circuit substrate 20 may be a flexible printed circuit board (FPCB). The upper protection layer 410 may expose the input pads 333. A first connection portion 21 may be disposed between the circuit substrate 20 and the input pads 333. The first connection portion 21 may include an anisotropic conductive film (ACF). For example, the first connection portion 21 may include a first adhesive polymer 22 and first conductive particles 23 provided in the first adhesive polymer 22. The circuit substrate 20 may be electrically connected to the input pads 333 through the first conductive particles 23. The circuit substrate 20 may be electrically connected to the semiconductor chip 200 through the input pattern IP.

The substrate 100s may electrically and physically connect the circuit substrate 20 and the display device 30 to each other. The lower protection layer 420 may expose the first and second output pads 313 and 323. Since the first output pads 313 are in direct contact with the first output vias 312, via pads may be omitted. Thus, a distance D between the semiconductor chip 200 and the one sidewall 100c of the substrate 100s may be reduced.

The display device 30 may be disposed on the second surface 100b of the substrate 100s and may be adjacent to the one sidewall 100c of the substrate 100s. A second connection portion 31 may be disposed between the display device 30 and the output pads 313 and 323. The second connection portion 31 may include an anisotropic conductive film (ACF). For example, the second connection portion 31 may include a second adhesive polymer 32 and second conductive particles 33 provided in the second adhesive polymer 32. The display device 30 may be electrically connected to the first and second output pads 313 and 323 through the second conductive particles 33. The display device 30 may be electrically connected to the semiconductor chip 200 through the first output pattern OP1 and the second output pattern OP2. Since the distance D between the semiconductor chip 200 and the one sidewall 100c of the substrate 100s is reduced, a size of the package module 1 or 2 may be reduced. Even though not shown in the drawings, the display device 30 may include a display substrate and a display panel.

As illustrated in FIG. 11B, the substrate 100s may be flexible and may be bent or folded. For example, portions (e.g., edge portions) of the substrate 100s may face each other.

As illustrated in FIG. 11C, the display device 30 may be flexible and may be bent or folded. For example, portions of one surface 30a of the display device 30 may face each other. In this case, the display device 30 may have another surface 30b opposite to the one surface 30a, and the second connection portions 31 may be provided on the another surface 30b of the display device 30.

According to some embodiments of the inventive concepts, the output pads may act as test pads, and thus the size of the film substrate may be reduced. The merging line may be disposed on the first region and the second region of the film substrate and may be connected to at least two of the output pads. One output probe may come in contact with one of a plurality of output pads connected to each other through the merging line. Thus, the electrical characteristics between the semiconductor chip and the plurality of output pads may be tested using the one output probe. Since the output probes come in contact with some of the output pads, the limitations of the pitch of the output pads may be reduced or minimized. Thus, the size of the film package may be reduced or minimized.

In addition, the output pads may be in direct contact with the output vias. Thus, the output pads may act as via pads.

While the inventive concepts have been described with reference to example embodiments, it will be apparent to those skilled in the art that various changes and modifications may be made without departing from the spirits and scopes of the inventive concepts. Therefore, it should be understood that the above embodiments are not limiting, but illustrative. Thus, the scopes of the inventive concepts are to be determined by the broadest permissible interpretation of the following claims and their equivalents, and shall not be restricted or limited by the foregoing description.

What is claimed is:

1. A film product, comprising:
a film substrate having a first surface and a second surface opposite the first surface, the film substrate having a length in a first direction and a width in a second direction perpendicular to the first direction;
a first plurality of pads on one of the first surface or the second surface, and the first plurality of pads arranged in a third direction, the third direction being diagonal with respect to at least one of the first direction or the second direction;
at least one merge line electrically connecting at least two of the first plurality of pads; and
a plurality of first vias extending from the first surface to the second surface, the plurality of first vias arranged in the third direction,
wherein each of the first plurality of pads are on a respective one of the plurality of first vias.

2. The film product of claim 1, wherein the merge line is on the one of the first surface or the second surface.

3. The film product of claim 1, wherein the two of the first plurality of pads are not adjacent pads.

4. The film product of claim 1, wherein the merge line has a U-shape.

5. The film product of claim 4, wherein a first leg of the U-shape is longer than a second leg of the U-shape.

6. The film product of claim 1, wherein a first pad of the two has a larger area than a second pad of the two.

7. The film product of claim 1, further comprising:
a first plurality of signal lines, each of the first plurality of signal lines electrically connected to a respective one of the first plurality of pads.

8. The film product of claim 7, wherein the first plurality of signal lines have different lengths.

9. The film product of claim 7, wherein the first plurality of signal lines are on a same surface as the first plurality of pads.

10. The film product of claim 7, wherein the first plurality of signal lines are on a different surface from the first plurality of pads, and the first plurality of signal lines are electrically connected to the first plurality of pads by corresponding ones of the plurality of first vias, respectively.

11. The film product of claim 1, wherein an area of each of the first plurality of pads is greater than an area of the respective one of the plurality of first vias.

12. The film product of claim 1, wherein the merge line is on a same one of the first surface or the second surface as the first plurality of pads.

13. The film product of claim 1, wherein the merge line is on a different one of the first surface or the second surface from the first plurality of pads.

14. The film product of claim 1, further comprising:
a first plurality of signal lines on the first surface, each of the first plurality of signal lines electrically connected to a respective one of the first plurality of vias; and wherein
the first plurality of pads are on the second surface.

15. The film product of claim 14, further comprising:
a second plurality of pads on the second surface, and the second plurality of pads arranged in a fourth direction, the fourth direction being diagonal with respect to at least one of the first direction or the second direction;
a second plurality of signal lines on the second surface, each of the second plurality of signal lines electrically connected to a respective one of the second plurality of pads; and
a plurality of second vias extending from the first surface to the second surface, each of the plurality of second vias electrically connected to a respective one of the second plurality of signal lines.

16. The film product of claim 15, further comprising:
at least one second merge line electrically connecting at least two of the second plurality of signal lines.

17. A film package, comprising:
a film substrate having a first surface and a second surface opposite the first surface, the film substrate having a length in a first direction and a width in a second direction perpendicular to the first direction;
a first plurality of pads on the second surface, and the first plurality of pads arranged in a third direction, the third direction being diagonal with respect to at least one of the first direction or the second direction;
a semiconductor chip on the first surface;
a first connection structure electrically connecting the semiconductor chip to the first plurality of pads, the first connection structure including a plurality of first vias extending from the first to the second surface, each of the plurality of first vias being electrically connected to a respective one of the first plurality of pads; and
a first plurality of conductive lines on the first surface, each of the first plurality of conductive lines extending from a first edge of the film substrate to a respective one of the plurality of first vias such that the first plurality of conductive lines have different lengths.

18. The film package of claim 17, further comprising:
a second plurality of pads on the second surface, and the second plurality of pads arranged in a fourth direction, the fourth direction being diagonal with respect to at least one of the first direction or the second direction; and
a second connection structure electrically connecting the semiconductor chip to the second plurality of pads.

19. The film package of claim 18, wherein
the first connection structure includes a first plurality of signal lines on the first surface, each of the first plurality of signal lines electrically connected to a respective one of the plurality of first vias and electrically connected to the semiconductor chip, the first plurality of signal lines have different lengths;
the second connection structure includes a second plurality of signal lines on the second surface, each of the second plurality of signal lines electrically connected to a respective one of the second plurality of pads, the second plurality of signal lines have different lengths, and the second connection structure includes a plurality of second vias extending between the first and second surfaces, and each of the plurality of second vias electrically connecting a respective one of the second plurality of signal lines to the semiconductor chip; and
a second plurality of conductive lines on the second surface, each of the second plurality of conductive lines extending from a second edge of the film substrate to a respective one of the second plurality of vias, the second edge is opposite the first edge.

* * * * *